United States Patent
Facchetti et al.

(10) Patent No.: US 9,171,961 B2
(45) Date of Patent: Oct. 27, 2015

(54) COATING MATERIALS FOR OXIDE THIN FILM TRANSISTORS

(71) Applicant: Polyera Corporation, Skokie, IL (US)

(72) Inventors: Antonio Facchetti, Chicago, IL (US); William Christopher Sheets, Chicago, IL (US); Don Frye, Skokie, IL (US); Jingqi Wang, Evanston, IL (US); Chung-Chin Hsiao, Hsinchu (TW); Minhuei Wang, Hsinchu County (TW)

(73) Assignee: Polyera Corporation, Skokie, IL (US)

( * ) Notice: Subject to any disclaimer, the term of this patent is extended or adjusted under 35 U.S.C. 154(b) by 183 days.

(21) Appl. No.: 13/844,571

(22) Filed: Mar. 15, 2013

(65) Prior Publication Data

US 2014/0021465 A1 Jan. 23, 2014

Related U.S. Application Data

(60) Provisional application No. 61/670,426, filed on Jul. 11, 2012.

(51) Int. Cl.
| | |
|---|---|
| H01L 29/786 | (2006.01) |
| H01L 51/30 | (2006.01) |
| H01L 51/00 | (2006.01) |
| H01L 51/05 | (2006.01) |
| H01L 29/49 | (2006.01) |

(52) U.S. Cl.
CPC ...... *H01L 29/78693* (2013.01); *H01L 29/4908* (2013.01); *H01L 29/7869* (2013.01); *H01L 29/78606* (2013.01); *H01L 51/0034* (2013.01); *H01L 51/0035* (2013.01); *H01L 51/052* (2013.01); *H01L 51/0545* (2013.01)

(58) Field of Classification Search
CPC ............. H01L 51/052; H01L 51/0545; H01L 29/7869; H01L 51/0043; H01L 51/0035; H01L 51/0034; H01L 29/4908
USPC ................ 257/40, 43, 60, E29.273; 427/487
See application file for complete search history.

(56) References Cited

U.S. PATENT DOCUMENTS

| | | | |
|---|---|---|---|
| 2008/0067503 A1* | 3/2008 | Kim et al. | 257/40 |
| 2008/0161524 A1* | 7/2008 | Yan et al. | 526/321 |
| 2009/0153056 A1 | 6/2009 | Chen et al. | 315/51 |

(Continued)

FOREIGN PATENT DOCUMENTS

WO     WO 2010057984 A2 *  5/2010

OTHER PUBLICATIONS

Theil, J.A., "Fluorinated amorphous carbon films for low permittivity interlevel dielectrics," *J. Vac. Sci. Technol. B*, 17(6): 2397-2410 (1999).

(Continued)

*Primary Examiner* — Marvin Payen
*Assistant Examiner* — Jeremy Joy
(74) *Attorney, Agent, or Firm* — Karen K. Chan

(57) ABSTRACT

The present teachings provide a coating composition (a passivation formulation) for preparing a coating material in a metal oxide thin film transistor, where the coating material comprises a polymer blend including a polymer and a stabilizing agent. Incorporation of a stabilizing agent according to the present teachings in the coating material can lead to improved device performance of the metal oxide thin film transistor, in particular, reduced shift in the threshold voltage and long-term bias-stress stability.

20 Claims, 9 Drawing Sheets

(56) References Cited

U.S. PATENT DOCUMENTS

| | | | |
|---|---|---|---|
| 2010/0084648 A1 | 4/2010 | Watanabe | 257/43 |
| 2010/0237337 A1* | 9/2010 | Kamura et al. | 257/40 |
| 2010/0252112 A1* | 10/2010 | Watson | 136/263 |
| 2011/0284849 A1* | 11/2011 | Marks et al. | 257/57 |
| 2012/0056183 A1* | 3/2012 | Mueller et al. | 257/57 |
| 2012/0267621 A1* | 10/2012 | Chen et al. | 257/43 |

OTHER PUBLICATIONS

Zhang, X-H. and Kippelen, B., "Low-voltage $C_{60}$ organic field-effect transistors with high mobility and low contact resistance," *Appl. Phys. Lett.*, 93: 133305-1-133305-3 (2008).

\* cited by examiner

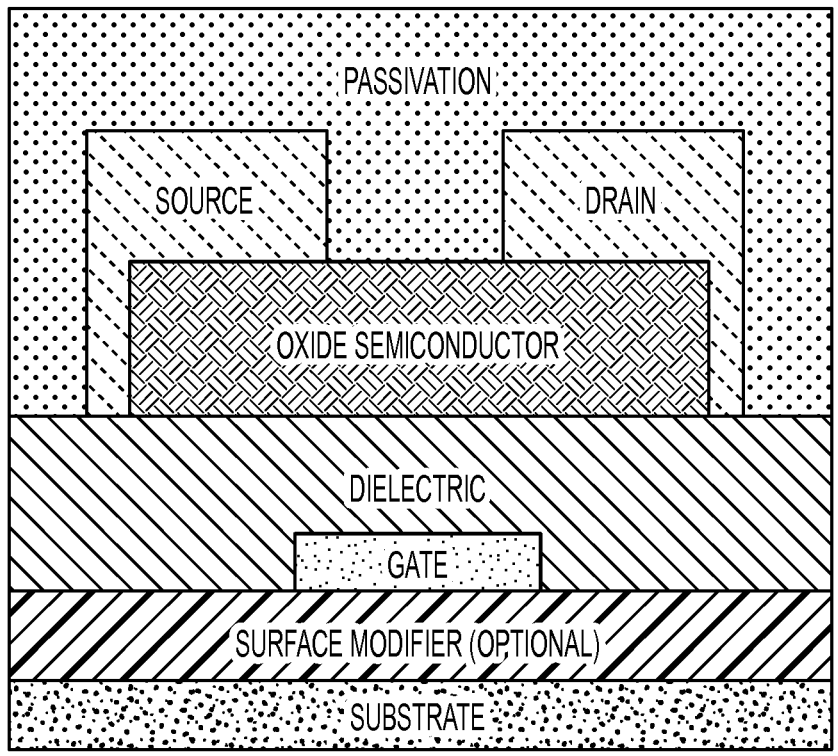
FIG. 1
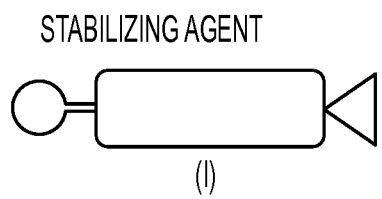
 = FIRST TERMINAL GROUP (HEAD GROUP, HG)
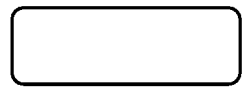 = SPACER GROUP (SG)
 = SECOND TERMINAL GROUP (TAIL GROUP, TG)
FIG. 2

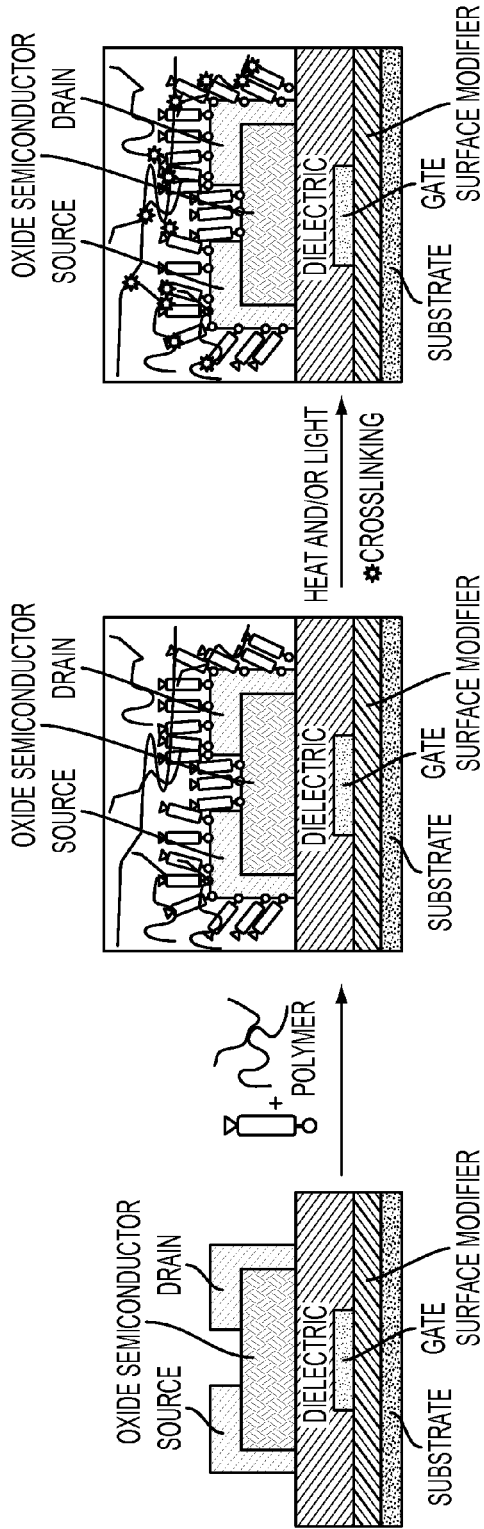
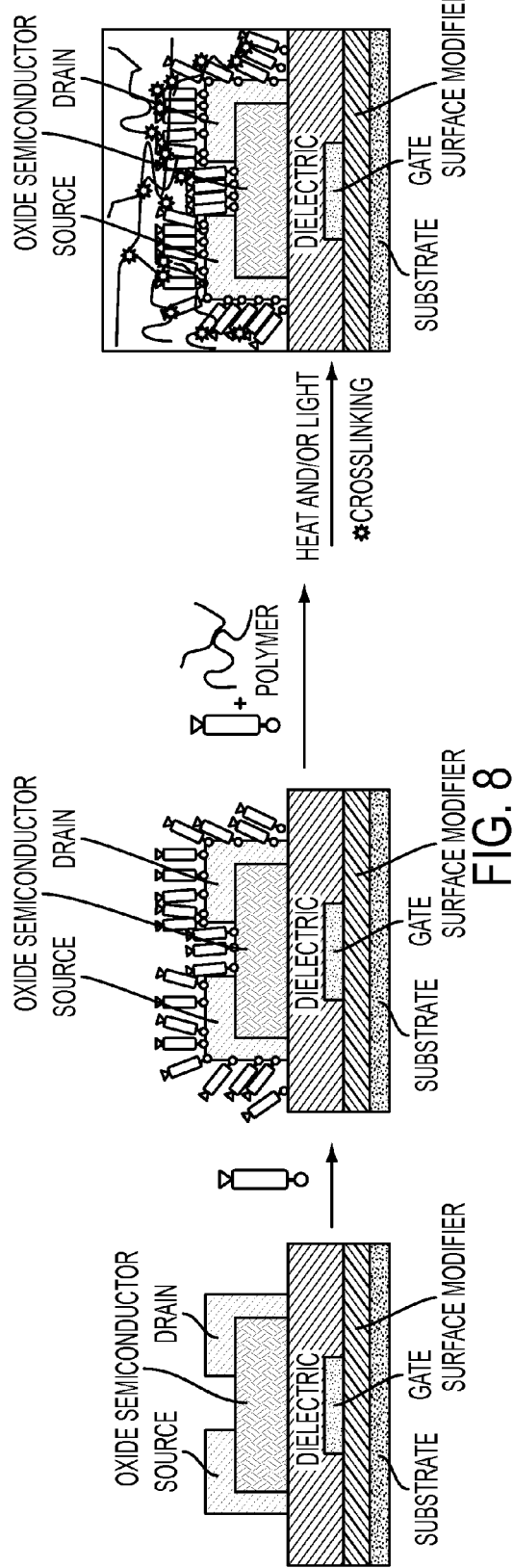

| CLASSIFICATION | % OF AREA REMOVED | SURFACE OF CROSS-CUT AREA FROM WHICH FLAKING HAS OCCURED FOR 6 PARRALLEL CUTS & ADHESION RANGE BY % |
|---|---|---|
| 5B | 0% NONE | |
| 4B | LESS THAN 5% | |
| 3B | 5 - 15% | |
| 2B | 15 - 35% | |
| 1B | 35 - 65% | |
| 0B | GREATER THAN 65% | |

COATING MATERIALS FOR OXIDE THIN FILM TRANSISTORS

CROSS-REFERENCE TO RELATED APPLICATIONS

This application claims priority to and the benefit of U.S. Provisional Patent Application Ser. No. 61/670,426, filed on Jul. 11, 2012, the disclosure of which is incorporated by reference herein in its entirety.

INTRODUCTION

In recent years, there has been a growing interest in developing electronic devices using (amorphous) metal oxide materials as the semiconductor component. Metal oxide electronics have shown great promise with demonstrated large-area compatibility and impressive device performance (electron mobility>10 cm$^2$/V·s) compared to the current dominant hydrogenated amorphous silicon (a-Si:H) technology (electron mobility ~1 cm$^2$/V·s). These promising properties have triggered efforts to fabricate metal oxide electronics on flexible plastic substrates compatible with low-cost, high-throughput roll-to-roll manufacturing processes. In particular, thin film transistor (TFT) technologies based upon amorphous oxide semiconductors are being actively investigated in connection with their use as switching devices or peripheral drivers in active matrix liquid crystal displays (AMLCDs) and as pixel drivers for active matrix organic light-emitting diodes (AMOLEDs).

Among various amorphous oxide candidates, indium gallium zinc oxide (IGZO) holds the most promise as the next-generation active channel material in TFTs for flexible display backplanes because of its high field-effect mobility, optical transparency, and processability at low-temperatures. Despite its promise, IGZO TFTs suffer from unreliable device operation due to its sensitivity to the environment. Specifically, adsorption/desorption of small molecular species present in ambient air onto the exposed back channel layer as well as light sensitivity (subgap photoresponse) can change the carrier concentration in the IGZO films. This results in a shift of the TFT threshold voltage ($V_{TH}$), which over time leads to a nonuniformity problem. Coating the IGZO channel layers with various inorganic and organic materials has been shown to improve device stability; however, there are known issues associated with state-of-the-art coating materials. For example, inorganic coating materials such as $SiO_2$ and $SiN_x$ deposited by plasma-enhanced chemical vapor deposition (PECVD) may cause degradation of electrical characteristics in IGZO TFTs due to plasma-induced radiation damage to the back-channel region of the TFTs. Meanwhile, many organic coating materials do not adhere well to the metallic source and drain contacts or to the IGZO film itself (due to the lack of chemical bonding), which is problematic for multistack formation and can create long-term stability problems. Most state-of-the-art organic coating materials also do not prevent chemi- or physi-sorption of small molecules contained in the ambient ($H_2O$, $O_2$, $O_3$, $CO_2$, CO, NO, $NO_2$), and/or do not prevent the formation of light-induced carriers.

Accordingly, there is a desire in the art for new coating materials which can improve the device stability of metal oxide TFTs.

SUMMARY

In light of the foregoing, the present teachings provide a coating material comprising a polymer blend that includes a polymer and a stabilizing agent. In some embodiments, the polymer blend material can be formed from a coating composition that includes both the polymer and the stabilizing agent. In some embodiments, the polymer blend material can be prepared by depositing the stabilizing agent in a first coating composition and depositing the polymer in a second coating composition (or vice versa). In some embodiments, the polymer blend material can be prepared by depositing the stabilizing agent in a first coating composition and depositing a second coating composition that includes both the polymer and the stabilizing agent. The stabilizing agent generally can be described as a compound which can chemically or physically adsorb on the metal oxide surface by elimination of a small molecule (e.g., water, hydrogen halides) to form a stable self-assembled monolayer (SAM). Furthermore, the stabilizing agent SAM can further induce desorption of physiadsorbed low-molecular weight molecules (e.g., $H_2O$, $O_2$, $O_3$, $CO_2$, CO, NO, $NO_2$) present near the surface of the metal oxide thin film semiconductor that would otherwise negatively affect the performance (e.g., cause instability) of the metal oxide thin film transistor. The stabilizing agent typically is present at a very small amount in the coating material, for example, in a range between about 0.01% and about 30% by weight of the polymer in the coating material. In preferred embodiments, the stabilizing agent can be present at less than about 20% by weight of the polymer, less than about 10% by weight of the polymer, or less than about 5% by weight of the polymer. The polymer in the present coating material can be selected from various polymers known to those skilled in the art that are useful as dielectric, photoresist, packaging, barrier, or passivation materials. The present teachings also relate to a metal oxide thin film transistor including a coating material as described herein as well as methods of fabricating such a metal oxide thin film transistor. Depending on the choice of the polymer, the present coating material can be used as a passivation material, a dielectric material, and/or an interfacial (e.g., surface modifier) material in a metal oxide thin film transistor such as in the embodiment illustrated in FIG. 1. The presence of the stabilizing agent can provide advantages such as improved device stability, surface dehydration, and/or better adhesion to an adjacent oxide or metallic layer.

The foregoing as well as other features and advantages of the present teachings will be more fully understood from the following figures, description, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

FIG. 1 shows a bottom-gate top-contact metal oxide thin film transistor (TFT) including a passivation layer, a dielectric layer, and a surface modifier layer, one or more of which can comprise the coating material according to the present teachings.

FIG. 2 illustrates the structure of an embodiment of a stabilizing agent according to the present teachings.

FIG. 7 illustrates an embodiment of how to fabricate a metal oxide transistor having a coating material according to the present teachings.

FIG. 8 illustrates an alternative embodiment of how to fabricate a metal oxide transistor having a coating material according to the present teachings.

FIG. 9A shows the results for negative gate bias temperature stress test. FIG. 9B shows the results for positive gate bias temperature stress test. T=80° C., $V_{GS}$=–30V, and $V_{DS}$=0V.

FIG. 10A shows the results for negative gate bias temperature stress test. FIG. 10B shows the results for positive gate bias temperature stress test. T=80° C., $V_{GS}$=–30V, and $V_{DS}$=0V.

FIG. 11A shows the results for negative gate bias temperature stress test. FIG. 11B shows the results for positive gate bias temperature stress test. T=80° C., $V_{GS}$=–30V, and $V_{DS}$=0V.

FIG. 12A shows the results for negative gate bias temperature stress test. FIG. 12B shows the results for positive gate bias temperature stress test. T=80° C., $V_{GS}$=–30V, and $V_{DS}$=0V.

FIG. 13A shows the results for negative gate bias temperature stress test. FIG. 13B shows the results for positive gate bias temperature stress test. T=80° C., $V_{GS}$=–30V, and $V_{DS}$=0V.

FIG. 15 shows the classification table according to standard adhesion test ASTM D3359.

DETAILED DESCRIPTION

Figure 3:
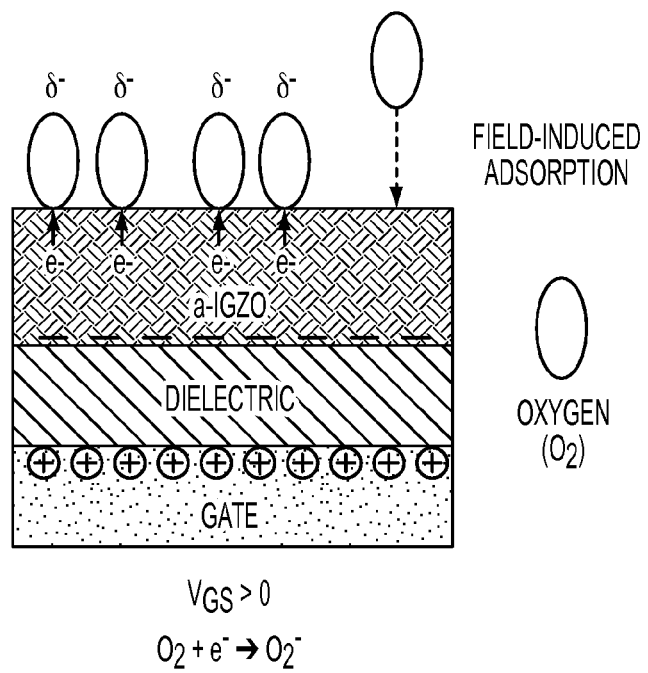
FIG. 3 illustrates a possible bias stress mechanism that may cause a positive shift in the threshold voltage due to adsorption of oxygen on the metal oxide semiconductor surface.

The present teachings provide a coating material (e.g., a passivation material) that can be incorporated in a metal oxide thin film transistor for various advantages. The coating material generally comprises a polymer blend that includes a polymer and a stabilizing agent. In some embodiments, the coating material can be prepared from a coating formulation (e.g., a passivation composition) that includes both the polymer and the stabilizing agent. In some embodiments, the coating material can be prepared from depositing the stabilizing agent in a first coating composition and depositing the polymer in a second coating composition (or vice versa). In some embodiments, the polymer blend material can be prepared by depositing the stabilizing agent in a first coating composition and depositing a second coating composition that includes both the polymer and the stabilizing agent. The depositing step typically is followed by curing (e.g., by heat and/or radiation) to achieve crosslinking between the polymer and the stabilizing agent. In various embodiments, the polymer and/or the stabilizing agent can be dispersed or dissolved together or separately in a solvent or solvent mixture. More specifically, the stabilizing agent is a compound capable of self-assembly adjacent to a metal oxide surface (either forming an under monolayer within the polymer blend material when deposited above the metal oxide layer or an upper monolayer within the polymer blend material when deposited under the metal oxide layer), where the formation of such a self-assembled monolayer can induce desorption of small molecules (e.g., water, hydrogen halides) present near the surface of the metal oxide thin film semiconductor that would otherwise hinder the performance (e.g., stability) of the metal oxide thin film transistor. Without limitation, examples of stabilizing agents suitable for the present coating composition can include various compounds that have been used to form self-assembled monolayers. Generally, the present stabilizing agent can be an amphiphilic compound that includes a first terminal group (or head group), a second terminal group (or tail group), and a spacer group therebetween, where the first terminal group (head group) comprises one or more chemical groups that are reactive in a condensation reaction. The second terminal group and the spacer group can be chosen for their compatibility with the particular polymer used in the coating material, and can be selected from various aliphatic moieties, aromatic moieties, and combinations thereof, where the aliphatic moieties and/or aromatic moieties can include one or more heteroatoms and/or one or more halogen atoms. The stabilizing agent typically is present as the minor component in the coating material, for example, in a range between about 0.01% and about 30% by weight of the polymer in the coating material. Without wishing to be bound by any particular theory, it is believed that the head group of the stabilizing agent can facilitate desorption of interfering species from the surface of the metal oxide thin film either by modifying the surface of the metal oxide thin film (e.g., via chemisorption), thereby altering the surface properties of the metal oxide thin film surface such that it is less prone to adsorption or absorption of oxygen or water species from the ambient, and/or by reacting with the interfering species themselves (e.g., via hydrolysis), thereby changing their chemical properties such that they no longer adsorb onto the metal oxide thin film surface. Furthermore, because these amphiphilic molecules can have a tuned electronic structure depending on the nature of the spacer/or tail group(s), they can act as light-induced carrier scavengers. Metal oxide thin film transistors incorporating the present coating material as well as display devices including such metal oxide thin film transistors also are within the scope of the present teachings.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

It will be understand that when two components are described as being coupled to each other, the two components can be directly in contact (e.g., directly coupled to each other), or the two components can be coupled to each other via one or more intervening components or layers.

As used herein, "halo" or "halogen" refers to fluoro, chloro, bromo, and iodo.

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_sH_{2s+1-t}X^0{}_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl(bicyclic), 2-naphthyl(bicyclic), anthracenyl(tricyclic), phenanthrenyl(tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., $—C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a $—Y—C_{6-14}$ aryl group, where Y is as defined herein. An example of an arylalkyl group is a benzyl group ($—CH_2—C_6H_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

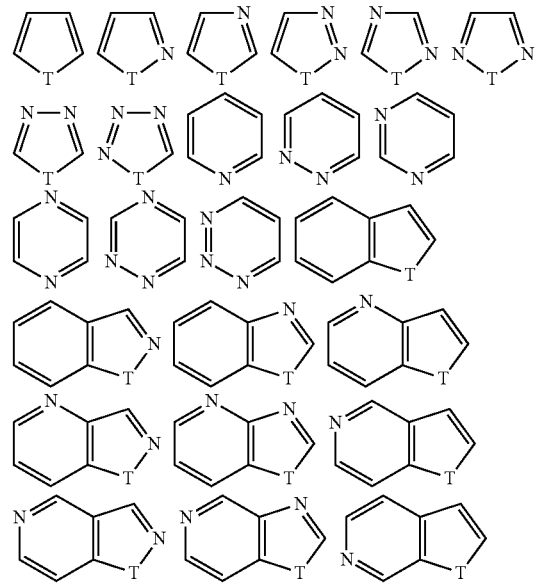

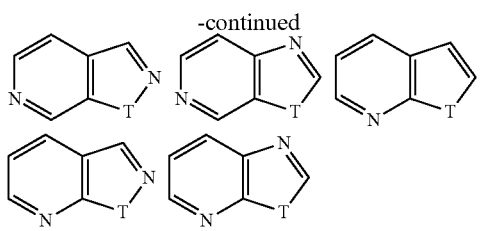

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Throughout the specification, structures may or may not be presented with chemical names. Where any question arises as to nomenclature, the structure prevails.

The polymer in the present coating material typically is a polymer functionalized with a polar group and generally include only small amounts of hydroxyl groups. In various embodiments, the polymer can be a polymer that can be thermally and/or photochemically crosslinked into a dense, physically robust film. Examples of suitable polymers include those described in co-pending, co-assigned U.S. Provisional Patent Application Nos. 61/596,217 and 61/586,999, International Publication No. WO 2010/136385, U.S. Patent Application Publication Nos. 2011/0215334 and 2011/0175089, and U.S. Pat. No. 7,981,989, the disclosure of each of which is incorporated by reference herein in its entirety. In some embodiments, the polymer can be a commercially available photoresist polymer, examples of which include epoxy-based polymers such as SU-8®, polyp-xylylene) polymers such as PARYLENE®, and fluoropolymers such as CYTOP®. Various acrylic, imide, and siloxane polymers suitable as dielectric, photoresist, or passivation materials known to those skilled in the art also may be used.

Additional examples of polymers that can be used in the present coating composition include, without limitation, fluorinated para-xylene, fluoropolyarylether, fluorinated polyimide, polystyrene, poly(α-methyl styrene), poly(α-vinyl-naphthalene), poly(vinyltoluene), polyethylene, cis-polybutadiene, polypropylene, polyisoprene, poly(4-methyl-1-pentene), poly(tetrafluorethylene), poly(chlorotrifluoroethylene), poly(2-methyl-1,3-butadiene), poly(α-α-α'-α'-tetrafluoro-p-xylylene), poly[1,1-(2-methyl propane)bis(4-phenyl)carbonate], poly(cyclohexyl methacrylate), poly(4-chlorostyrene), poly(2,6-dichlorostyrene), poly(4-bromostyrene), poly(2,6-dimethyl-1,4-phenylene ether), polyisobutylene, poly(vinyl cyclohexane), poly(arylene ether), polyphenylene, poly(ethylene/tetrafluoroethyelene), poly(ethylene/chlorotrifluoroethylene), fluorinated ethylene/propylene copolymer, polystyrene-co-α-methyl styrene, ethylene/ethyl acetate copolymer, poly(styrene/butadiene), poly(styrene/2,4-dimethylstyrene), polypropylene-co-1-butene, poly(methyl methacrylate), poly(ethyl methacrylate), poly(2-hydroxyethyl methacrylate), poly(butyl methacrylate), poly(hexyl methacrylate), poly(benzyl methacrylate), poly(isobutylene/methyl methacrylate), poly(vinyl chloride), polysaccharides such as 2-hydroxyethyl cellulose, cellulose actate, cellullose acetate butyrate, ethyl cellulose; cyanated (ethoxylated) polysaccharides such as cyanopullulan (e.g., CYMM®), benzocyclobutene-based polymers, poly(2-vinylpyridine), poly(4-vinylpyridine), poly(4-vinylpyridine-co-butyl methacrylate), poly(4-vinylpyridine-co-styrene), poly(1-vinylpyrrolidone-co-styrene), poly(1-vinylpyrrolidone-co-vinyl acetate), poly(vinylidine fluoride), polyacrylonitrile, poly(acrylonitrile-co-butadiene-co-styrene), poly(acrylonitrile-co-methyl acrylate), polyacrylamide, poly(N-isopropylacrylamide), poly(2-ethyl-2-oxazoline), polyvinylpyrrolidone, poly(pentafluorostyrene), poly(dimethylsiloxane), poly(tetrahydrofuran), poly(methyl vinyl ether), poly(methyl vinyl ether-alt-maleic anhydride), poly(ethyl vinyl ether), poly(ethylene-alt-maleic anhydride), poly(allylamine), poly(ethyleneimine), poly(vinyl acetate), poly(vinyl cinnamate), poly(vinyl stearate), poly(vinyl propionate), poly(vinyl formate), poly(styrene-co-acrylonitrile), poly(maleic anhydride-alt-1-octadecane), poly(tetrahydrofuryl methacrylate), poly(Bisphenol A carbonate), polypropylene carbonate), poly(1,4-butylene terephthalate), poly(diallyl isophthalate), poly(hexafluoropropylene oxide), poly(fluoropropylene oxide-co-perfluoroformaldehyde), and combinations thereof.

In preferred embodiments, the polymer should have satisfactory solubility in various common solvents, thereby affording formulations that are suitable for solution-phase processes. Depending on the deposition techniques to be used, the concentration of the polymer in the present composition can vary greatly (e.g., from about 1 mg/ml to about 1000 mg/ml). Examples of organic solvents that can be used in the present composition include aliphatic hydrocarbons such as hexanes, cyclopentane, cyclohexane, cyclooctane, n-nonane, n-decane, n-undecane, n-dodecane; alcohol solvents such as methanol, ethanol, isopropanol, 1-butanol, 2-ethoxymethanol, 3-methoxypropanol, cyclopentanol, cyclohexanol, and heptanol; ketone solvents such as acetone, acetylacetone, methyl ethyl ketone, methyl isobutyl ketone, 2-pentanone, 3-pentanone, 2-heptanone, 3-heptanone, cyclopentanone, and cyclohexanone; ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate, methyl lactate, ethyl lactate and γ-butyrolactone; ether solvents such as diisopropyl ether, dibutyl ether, ethyl propyl ether, anisole, phenetole, and veratrole; and amide solvents such as N-methylpyrrolidinone and dimethylacetamide. These solvents can be used either singly or in combination, or as mixtures with water.

The stabilizing agent in the present coating material can have the general structure (I) shown in FIG. 1 (HG-SG-TG). Referring to FIG. 1, the present stabilizing agent can have a first terminal group (head group, HG), a spacer group (SG), and a second terminal group (tail group, TG). The head group (HG) generally is a functional group that is reactive to surface groups found in metal oxide semiconductors or metallic contacts used in metal oxide transistors. For example, HG can be selected from a) —Si($R^1$)$_3$, b) —P(O)(O$R^2$)$_2$, c) —COOH, d) —NCO, and e) —CNO; wherein $R^1$ and $R^2$, at each occurrence, independently can be selected from a) H, b) a halogen, c) a $C_{1-20}$ alkoxy group and d) a $C_{1-20}$ alkyl group. The spacer group (SG) can include one or more aliphatic and/or aromatic moieties where one or more carbon atoms can be replaced by a heteroatom and where one or more hydrogen atoms can be replaced by a halogen atom. In some embodiments, SG can be absent (i.e., SG is a covalent bond). Accordingly, in certain embodiments, SG can be selected from a) a covalent bond, b) a divalent $C_{1-20}$ alkyl group, c) a divalent $C_{2-20}$ alkenyl group, d) a divalent $C_{2-20}$ alkynyl group, e) a divalent $C_{1-20}$ alkoxy group, f) a divalent $C_{1-20}$ alkylthio group, g) a divalent $C_{1-20}$ haloalkyl group, h) a divalent $C_{3-14}$ cycloalkyl group, i) a divalent $C_{6-14}$ aryl group, j) a divalent 3-14 membered cycloheteroalkyl group, k) a divalent 5-14 membered heteroaryl group, and l) a combination of any two or more of a)-k), where each of the $C_{1-20}$ alkyl group, the $C_{2-20}$ alkenyl group, the $C_{2-20}$ alkynyl group, the $C_{1-20}$ alkoxy group, the $C_{1-20}$ alkylthio group, the $C_{3-14}$ cycloalkyl group, the $C_{6-14}$ aryl group, the 3-14 membered cycloheteroalkyl group, and the 5-14 membered heteroaryl group can be substituted with 1-5 groups selected from halogen, —CN, and a $C_{1-20}$ haloalkyl group. The tail group (TG) can be an inactive group (e.g., H or a $C_{1-20}$ alkyl group) or can comprise a functional group that is reactive towards specific functional groups present in the polymer (for example, to allow crosslinking with the polymer). Accordingly, in certain embodiments, TG can be selected from a) H, b) halogen, c) —CN, d) —NO$_2$, e) —O$R^3$, f) —SH, g) —N($R^4$)$_2$, h) —CHO, i) —C(O)$R^3$, j) —C(O)O$R^3$, k) —C(O)N($R^4$)$_2$, l) a $C_{1-20}$ alkyl group, m) a $C_{1-20}$ haloalkyl group, n) $C_{2-20}$ alkenyl group, o) a $C_{2-20}$ alkynyl group, p) a $C_{6-14}$ aryl group, and q) a 5-14 membered heteroaryl group, wherein $R^3$ independently can be selected from a) H, b) a $C_{1-20}$ alkyl group, and c) a $C_{1-20}$ haloalkyl group; and $R^4$, at each occurrence, independently can be selected from a) H, b) a $C_{1-20}$ alkyl group, c) a —$C_{1-20}$ alkyl —NH$_2$; and each of the $C_{6-14}$ aryl group and the 5-14 membered heteroaryl group optionally can be substituted with 1-5 groups selected from a) halogen, b) a $C_{1-20}$ alkyl group, c) a $C_{1-20}$ haloalkyl group and d) a $C_{1-20}$ alkoxy group. In various embodiments, the present stabilizing agent is an asymmetric compound with different head and tail groups. In some embodiments, the present stabilizing agent can be an amphiphilic compound.

The present stabilizing agent can be adapted to be compatible with the polymer used in the coating material. Specifically, the spacer group and/or the tail group of the stabilizing agent can be selected to be structurally similar to specific chemical groups present in the polymer. For example, if a fluoropolymer is used, the spacer group and/or the tail group of the stabilizing agent can comprise a fluoroalkyl group. Similarly, the spacer group and/or the tail group of the stabilizing agent can include an aromatic group if the polymer used in the coating material includes aromatic group(s) in its backbone and/or its side chains. In certain embodiments, the stabilizing agent can include a crosslinkable spacer and/or tail group. For example, if the polymer is photocrosslinkable (e.g., a cinnamate-based polymer), then the spacer and/or the tail group can comprise the same group (e.g., cinnamate) used in the crosslinking chemistry. If the polymer is thermally crosslinkable (e.g., a diene-containing polymer), then the spacer and/or the tail group can comprise a diene moiety. In particular embodiments, the stabilizing agent can comprise a crosslinkable spacer and/or tail group and can be represented by the general structure:

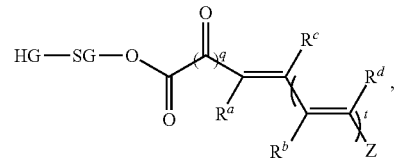

wherein:

HG is selected from the group consisting of a) —Si($R^1$)$_3$, b) —P(O)(O$R^2$)$_2$, c) —COOH, d) —NCO, and e) —CNO; wherein $R^1$ and $R^2$, at each occurrence, independently is selected from the group consisting of a) H, b) a halogen, c) a $C_{1-20}$ alkoxy group and d) a $C_{1-20}$ alkyl group;

SG is a divalent $C_{1-20}$ alkyl group;

Z is selected from the group consisting of a $C_{1-10}$ alkyl group, a $C_{1-10}$ haloalkyl group, a substituted or unsubstituted $C_{6-14}$ aryl group, and a substituted or unsubstituted 5-14 membered heteroaryl group;

$R^a$ and $R^b$ independently are selected from the group consisting of H, F, Cl, CN, CH$_3$, and CF$_3$;

$R^c$ and $R^d$ independently are selected from the group consisting of H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group; and q and t independently are 0 or 1.

In some embodiments, the head group of the stabilizing agent can be a functionalized silyl group or a phosphonic acid group. Accordingly, in certain embodiments, the present stabilizing agent can be a trichlorosilane, a trimethoxysilane, or a triethoxysilane. Specific examples can include n-octadecyltrichlorosilane (OTS), 11-bromo undecyltrichlorosilane (BTS), 1H,1H,2H,2H-perfluoro-decyltrichlorosilane (PFDTS), N-[3-(trimethoxysilyl)propyl]-ethylenediamine (EDATMS), (3-aminopropyl)trimethoxy-silane (APTMS), (3-aminopropyl)-triethoxysilane (APTES), N-(6-aminohexyl)-3-aminopropyltrimethoxysilane (AHAPS), (3-mercaptopropyl)trimethoxysilane (MPTMS) and poly(ethylene glycol) (PEG) silanes:

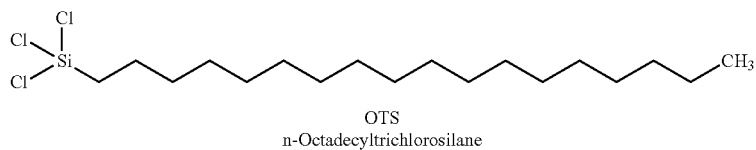
OTS
n-Octadecyltrichlorosilane

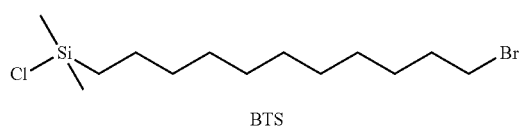
BTS
11-Bromo undecyltrichlorosilane

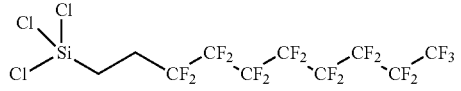
PFDTS
1H,1H,2H,2H-Perfluoro-decyltrichlorosilane

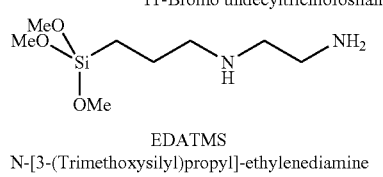
EDATMS
N-[3-(Trimethoxysilyl)propyl]-ethylenediamine

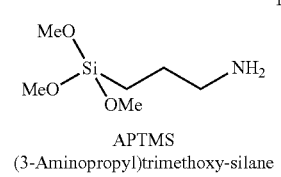
APTMS
(3-Aminopropyl)trimethoxy-silane

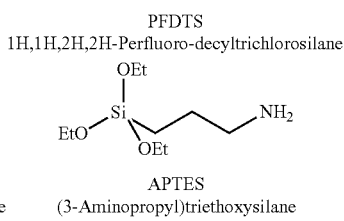
APTES
(3-Aminopropyl)triethoxysilane

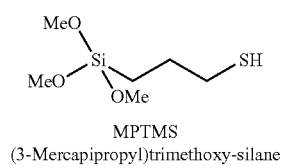
MPTMS
(3-Mercapipropyl)trimethoxy-silane

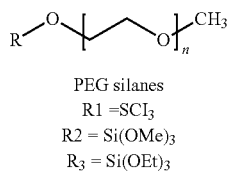
PEG silanes
R1 =SCl$_3$
R2 = Si(OMe)$_3$
R$_3$ = Si(OEt)$_3$

Poly(ethylene glyccol)
R1 = trichlorosiloxane
R2 = trimethoxysiloxane
R3 = triethoxysiloxane

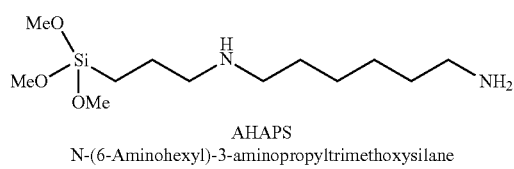
AHAPS
N-(6-Aminohexyl)-3-aminopropyltrimethoxysilane

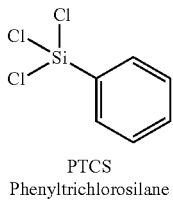
PTCS
Phenyltrichlorosilane

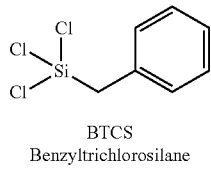
BTCS
Benzyltrichlorosilane

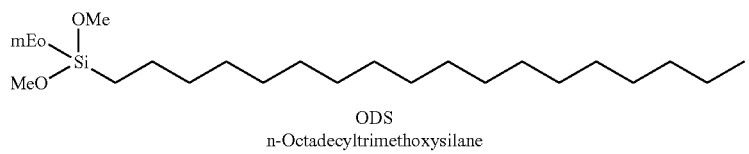
ODS
n-Octadecyltrimethoxysilane

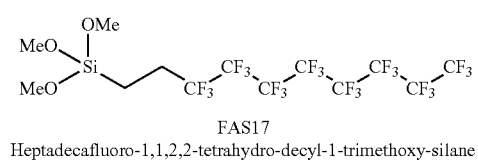
FAS17
Heptadecafluoro-1,1,2,2-tetrahydro-decyl-1-trimethoxy-silane

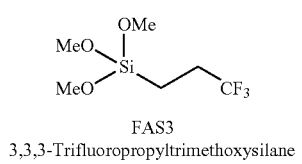
FAS3
3,3,3-Trifluoropropyltrimethoxysilane

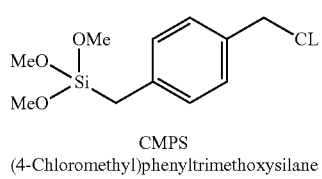
CMPS
(4-Chloromethyl)phenyltrimethoxysilane

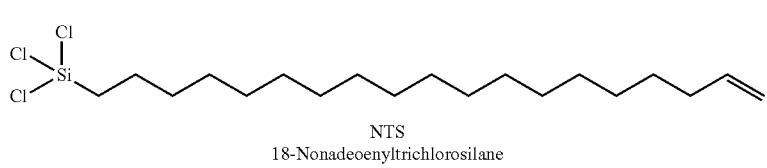
NTS
18-Nonadeoenyltrichlorosilane

In other embodiments, the present stabilizing agent can be a phosphonic acid. For example, the phosphonic acid can be selected from hexylphosphonic acid (HPA), octylphosphonic acid (OPA), octadecylphosphonic acid (ODPA), benzylphosphonic acid (BnPA 3,3,4,4,5,5,6,6,7,7,8,8,8-tridecafluorooctyl phosphonic acid ($F_{13}$OPA), 4-(trifluoromethyl)phenylphosphonic acid (pCF$_3$PhA), 3,4,5-trifluorophenylphosphonic acid (mpF$_3$PhPA), (perfluoro-1,4-phenylene)bis(methylene)diphosphonic acid (F$_4$BndiPA), 2,6-difluorobenzylphosphonic acid (oF$_2$BnPA), 4-fluorobenzylphosphonic acid (pFBnPA), pentafluorobenzylphosphonic acid (F$_5$BnPA), 3,5-difluorobenzylphosphonic acid (mF$_2$BnPA), 3,4,5-trifluorobenzylphosphonic acid (mpF$_3$BnPA), and 4-(trifluoromethyl)benzylphosphonic acid (pCF$_3$BnPA):

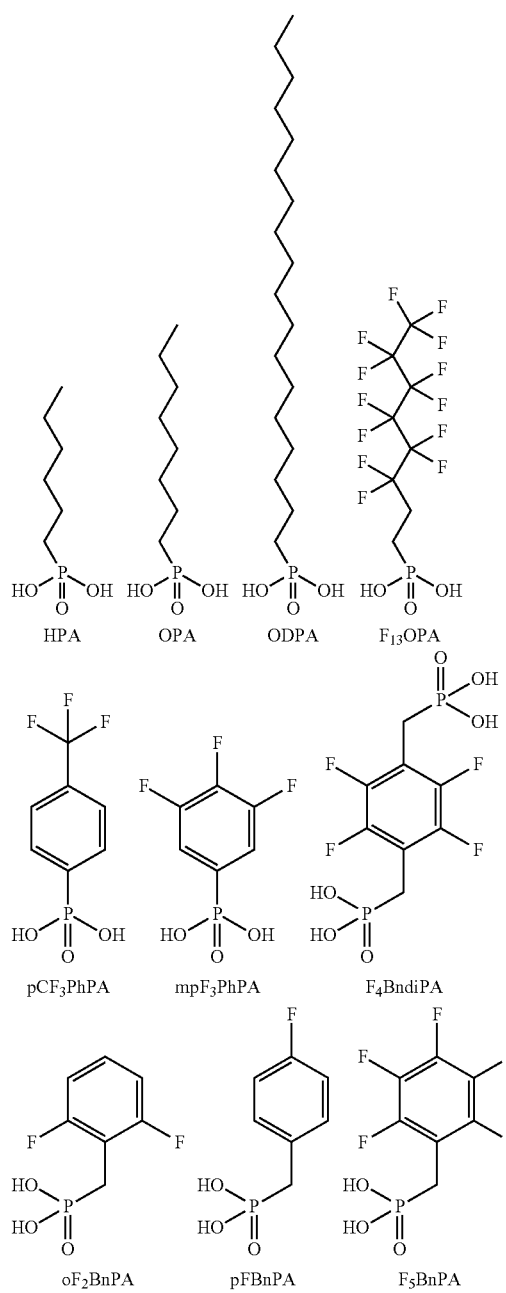

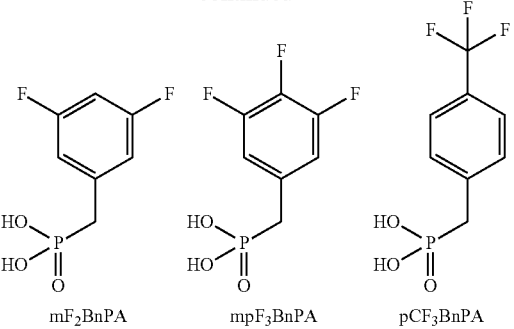

In certain embodiments, the present coating material can include a photocrosslinkable polymer and a photocrosslinkable stabilizing agent. In particular embodiments, the photocrosslinkable polymer can be a condensation product of a photocrosslinkable acetic acid or carbonyl acetic acid (or an acid chloride/anhydride thereof) and a hydroxy-containing polymers such as poly(vinylphenol), poly(vinylalcohol), or poly(hydroxyethyl methacrylate). For example, the photocrosslinkable (carbonyl)acetic acid used to functionalize the hydroxyl-containing polymers can be selected from:

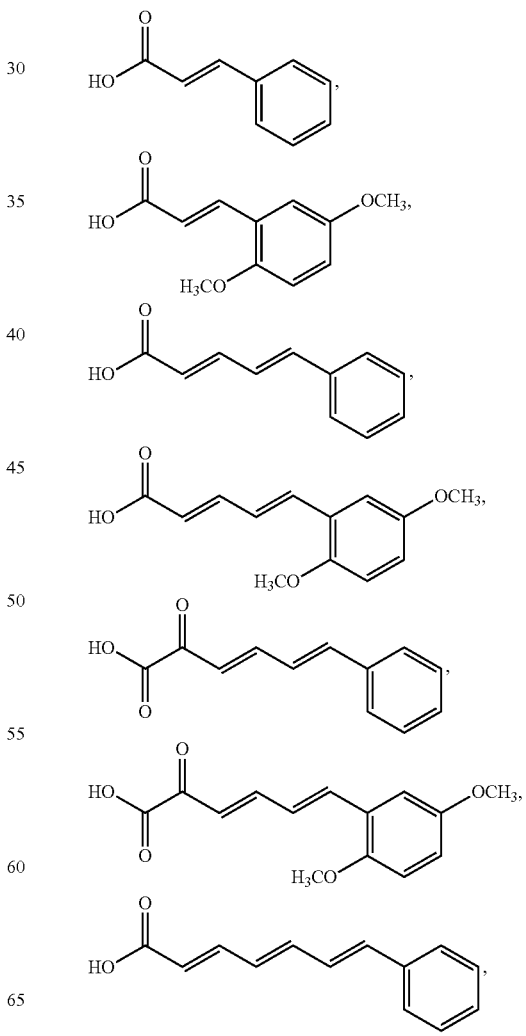

-continued

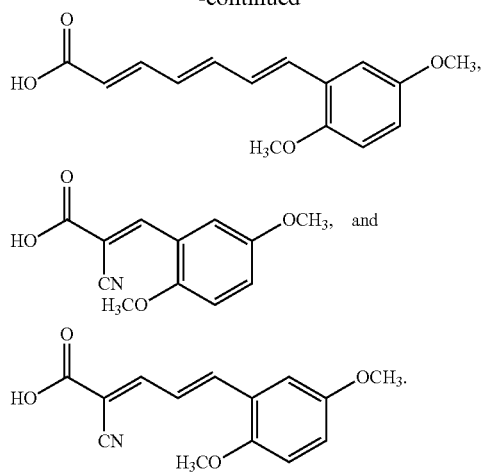

The photocrosslinkable stabilizing agent accordingly can be a phosphonic acid having a photocrosslinkable group that corresponds to the photocrosslinkable group of the photocrosslinkable polymer. For example, the photocrosslinkable stabilizing agent can be selected from the group consisting of:

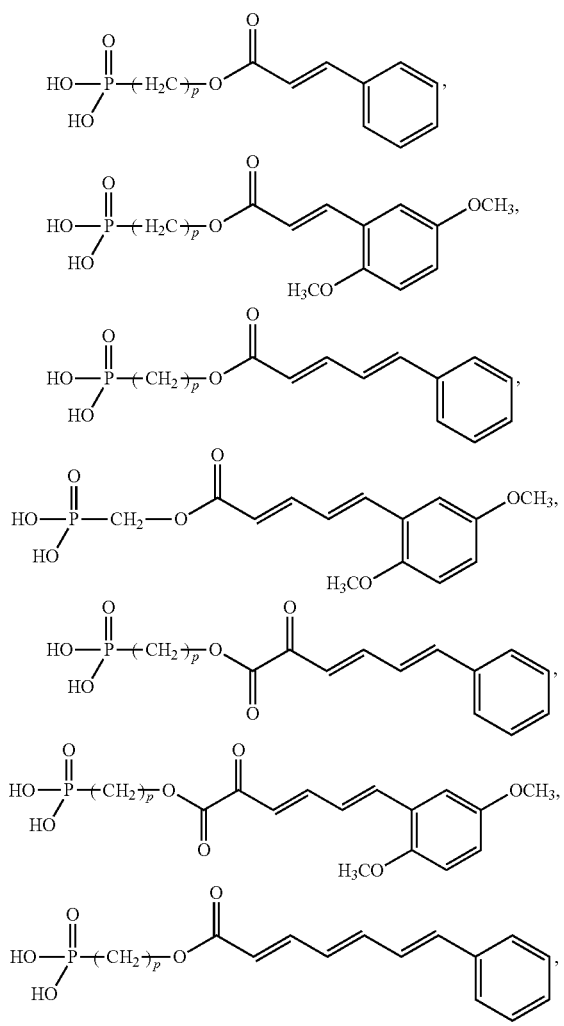

-continued

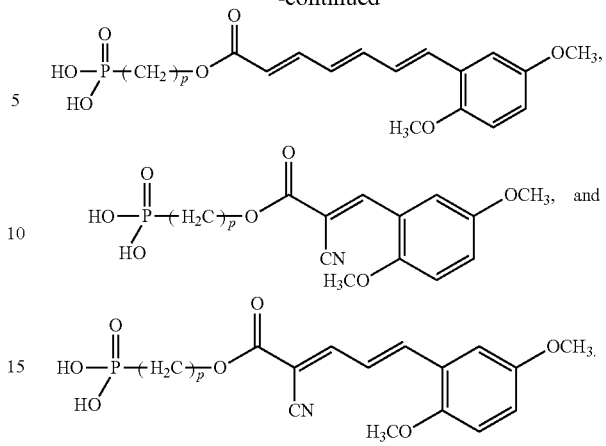

where p is an integer in the range of 1 to 20 (inclusive). For example, p can be selected from 3, 4, 5, 6, 7, 8, 9, 10, 11, 12, 13, 14, 15, 16, 17, 18, 19, and 20.

Specific examples of the present stabilizing agent which are photocrosslinkable can include:

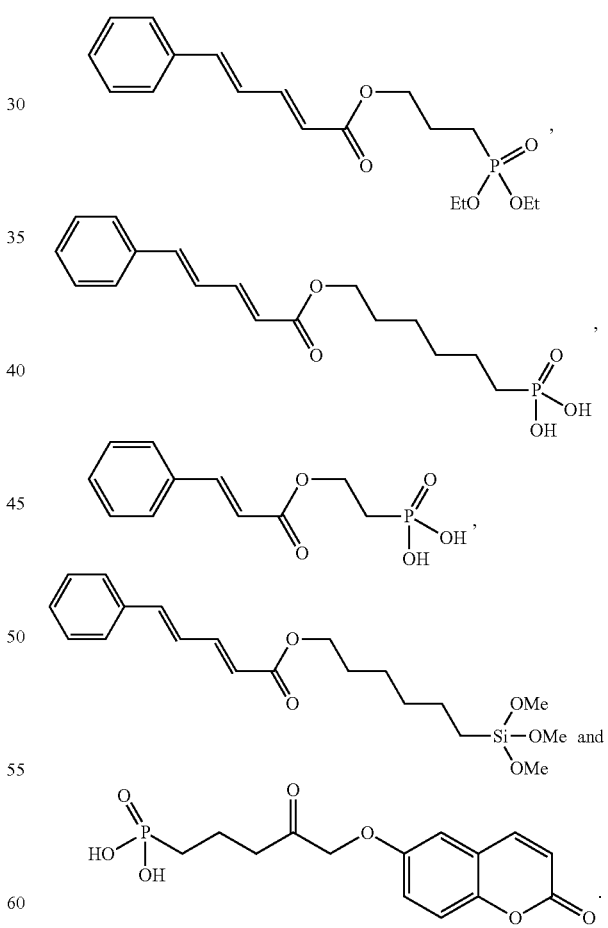

In other embodiments, the present coating material can include a thermally or photocrosslinkable (dual cure) small molecule or polymer and a thermally or photocrosslinkable (dual cure) stabilizing agent. In particular embodiments, the crosslinkable oligomer or polymer can contain an epoxy function and can be selected from those known in the art. Examples of such epoxy-containing oligomers and polymers include:
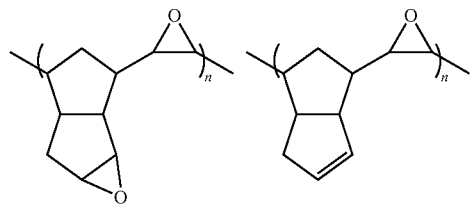
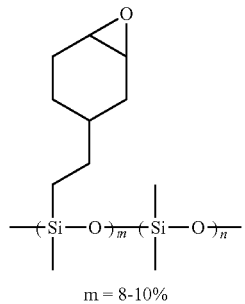
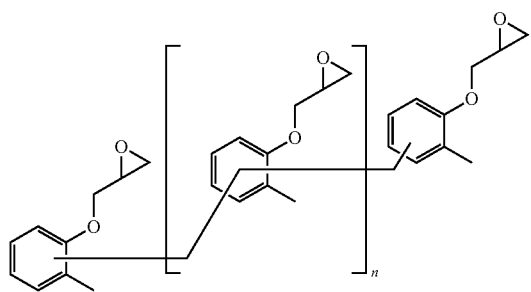
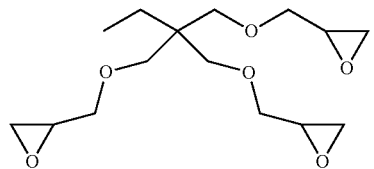
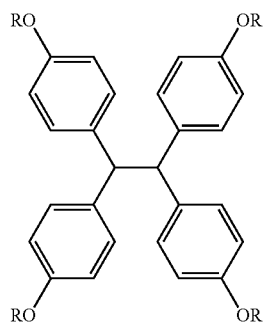
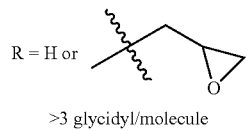
>3 glycidyl/molecule
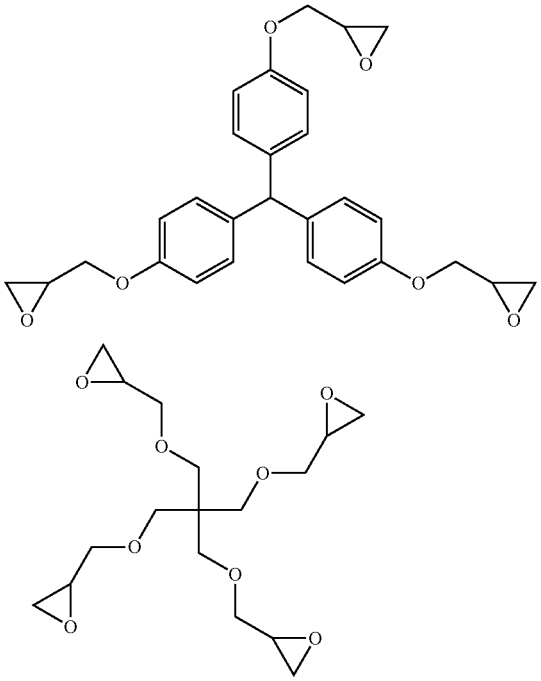
Specific examples of the present stabilizing agents which are thermally or photocrosslinkable (dual cure) can include:
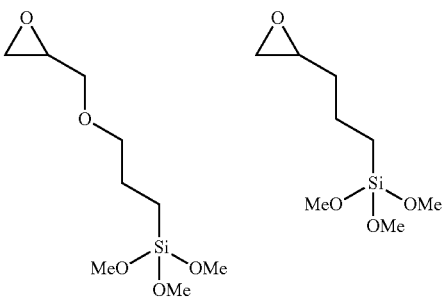
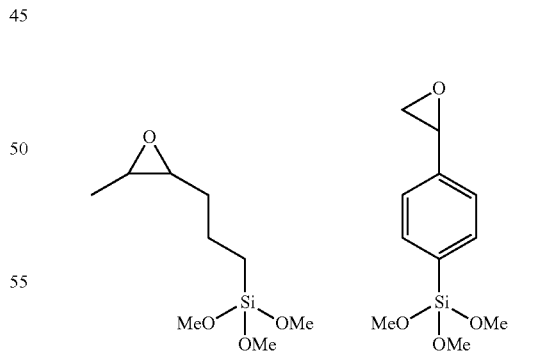
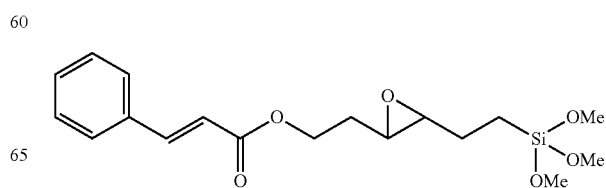

-continued

[chemical structure]

The stabilizing agent typically is present at a very small amount in the present coating material, for example, in a range between about 0.01% and about 30% by weight of the polymer in the coating material. In preferred embodiments, the stabilizing agent can be present at less than about 20% by weight of the polymer, less than about 10% by weight of the polymer, or less than about 5% by weight of the polymer. Without wishing to be bound by any particular theory, it is believed that by incorporating a stabilizing agent according to the present teachings in the coating material, interfering species (e.g., $H_2O$, $O_2$, $O_3$, NO, CO, $CO_2$) from the ambient are less likely to be adsorbed onto the top surface of the metal oxide channel layer (i.e., the back channel) and any interfering species that have been adsorbed onto the back channel during device processing will be desorbed therefrom through interaction (e.g., hydrogen bonding) or reaction (e.g., hydrolysis) with the stabilizing agent. In turn, this can lead to a reduced shift in the threshold voltage and improvement in the long-term bias-stress stability of the metal oxide thin film transistor.

Figure 4:
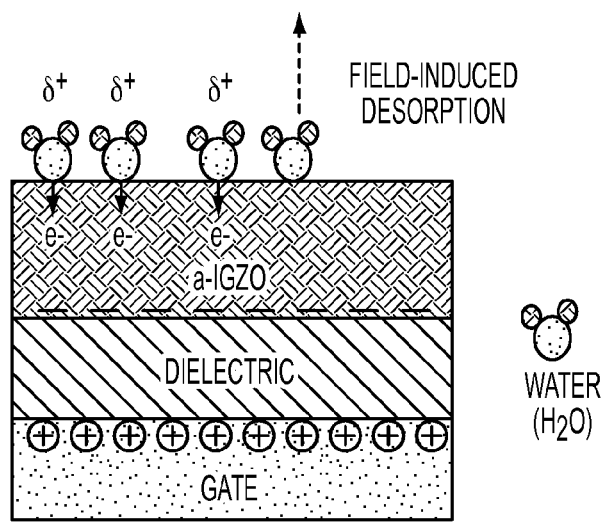
FIG. 4 illustrates a possible bias stress mechanism that may cause a negative shift in the threshold voltage due to adsorption of water on the metal oxide semiconductor surface.

FIGS. 3 and 4 illustrate two possible bias stress mechanisms that may cause a shift in the threshold voltage due to adsorption of oxygen or water on the oxide semiconductor surface. Referring to FIG. 3, oxygen from the ambient adsorbed on the oxide semiconductor surface can draw electrons from the IGZO semiconductor to form $O_2^-$ species. These $O_2^-$ species can act as electron traps which leads to a positive $V_{TH}$ shift. Referring to FIG. 4, when a positive gate bias is applied, water molecules from the ambient adsorbed on the oxide semiconductor surface can act as electron donors, which leads to a negative $V_{TH}$ shift. In either case, the amount of $V_{TH}$ shift will depend on the thickness of the IGZO layer.

Figure 5:
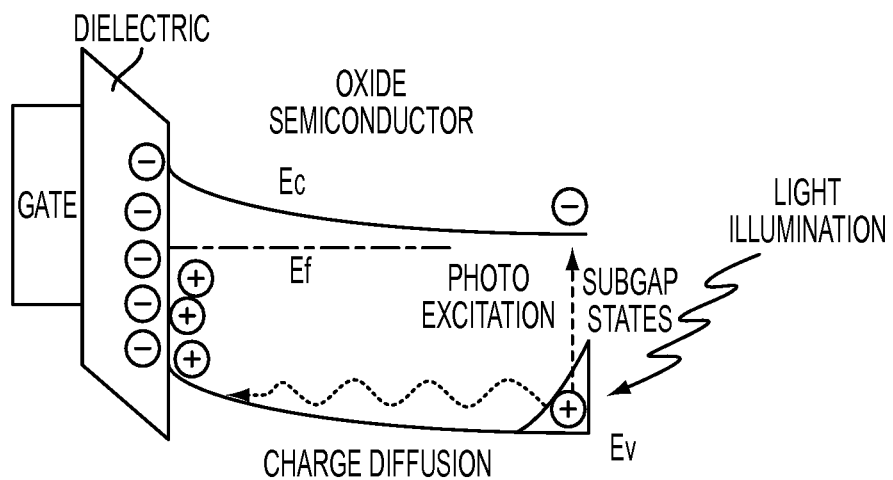
FIG. 5 illustrates a possible mechanism that may lead to an enhanced negative bias stress under light illumination.

It has been suggested that the combination of sub-band gap photon and negative bias stress can create subgap state in a-IGZO TFT that accelerates negative bias instability under illumination. See Oh et al., *Appl. Phys. Lett.*, vol. 97, pp. 183502-1 (2010). The enhanced negative bias stress can be explained by the accumulation of positive charges at the channel/gate dielectric interface as shown in FIG. 5. In this model, holes are generated in the near-VBM (valence band minima) states through electron excitation to the conduction band by subgap photons (light illumination) and the generation region should be in the vicinity of the surface region. The photogenerated holes migrate to the depletion layer by thermal diffusion and then collected on the gate dielectric interface with the aid of the high electrical field in the depletion layer. The holes are then captured by donor-like states at the interface, form fixed positive charges, and cause negative bias stress.

Figure 6:
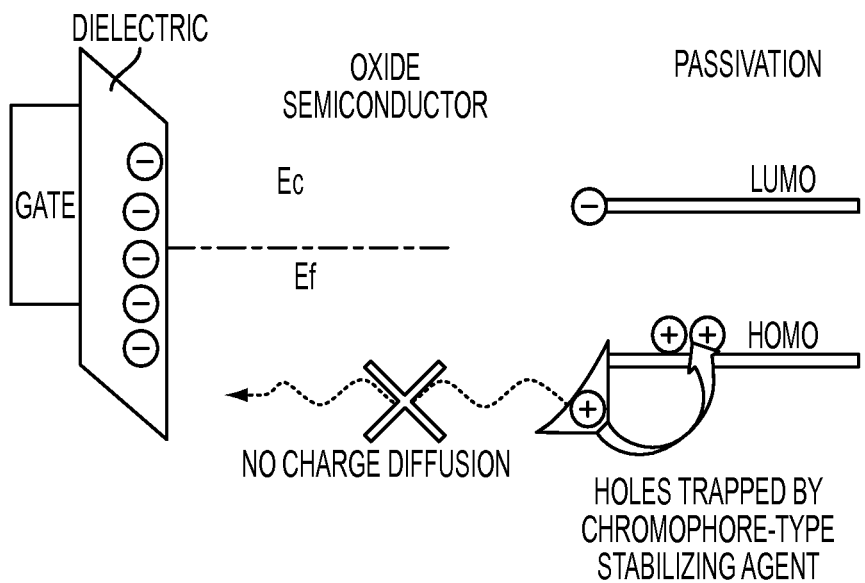
FIG. 6 illustrates how certain embodiments of the present stabilizing agent can reduce the type of negative bias stress shown in FIG. 5 by trapping the photo-excited holes near the back channel surface.
Figure 9:
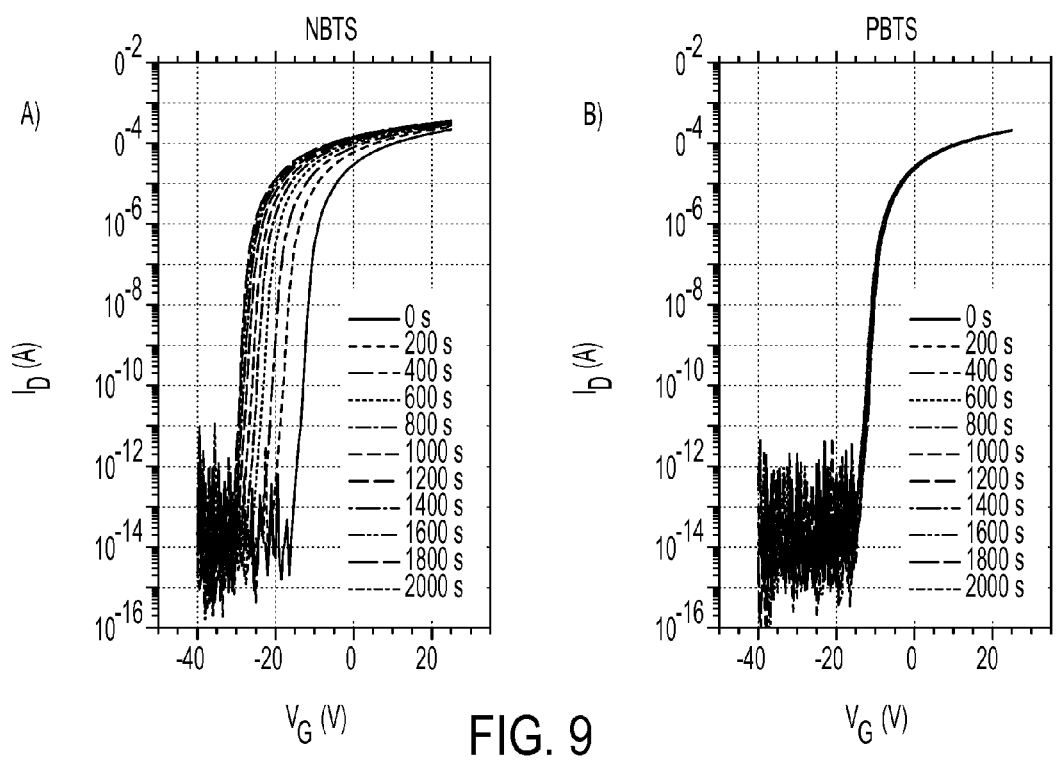
FIG. 9 shows the transfer characteristics of a comparative IGZO TFT device having the structure shown in FIG. 1 and a passivation layer composed of a photocrosslinkable polymer only (i.e., without a stabilizing agent according to the present teachings).
Figure 10:
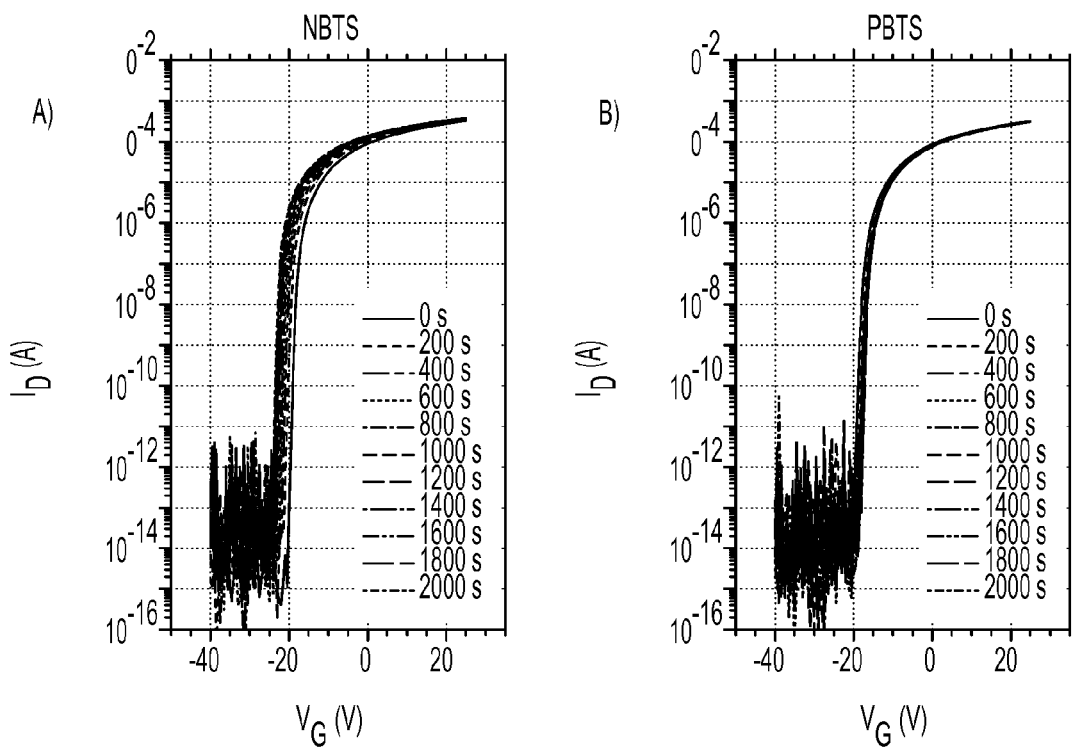
FIG. 10 shows the transfer characteristics of an IGZO TFT according to the present teachings having the structure shown in FIG. 1 and a passivation layer composed of a photo-crosslinkable polymer and a photocrosslinkable stabilizing agent (6% by weight of the photocrosslinkable polymer).
Figure 11:
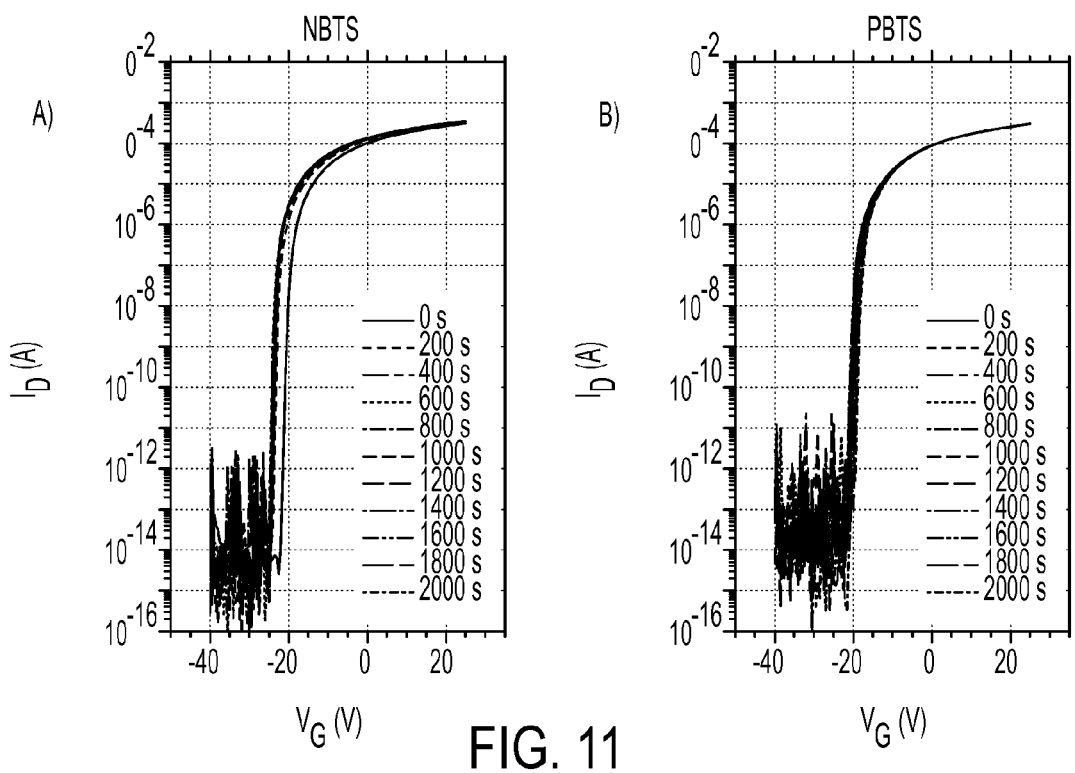
FIG. 11 shows the transfer characteristics of an IGZO TFT according to the present teachings having the structure shown in FIG. 1 and a passivation layer composed of a photo-crosslinkable polymer and a photocrosslinkable stabilizing agent (10% by weight of the photocrosslinkable polymer).
Figure 12:
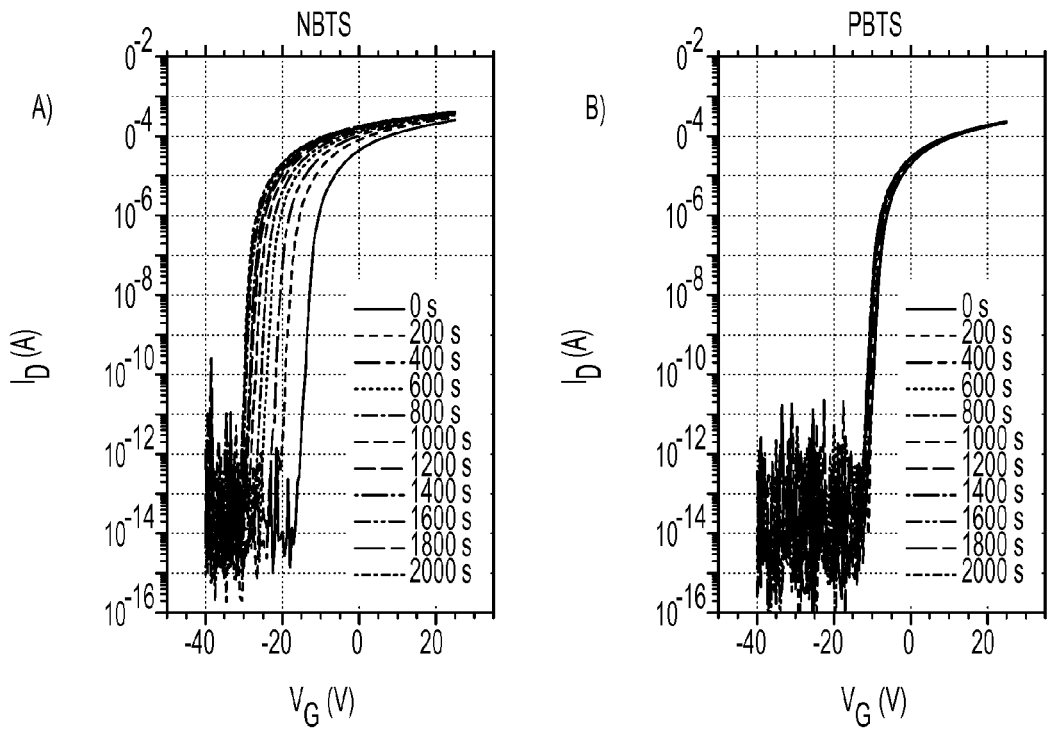
FIG. 12 shows the transfer characteristics of a comparative IGZO TFT having the structure shown in FIG. 1 and a passivation layer composed of a photocrosslinkable polymer only, further having a top self-assembled monolayer composed of a photocrosslinkable phosphonic acid.
Figure 13:
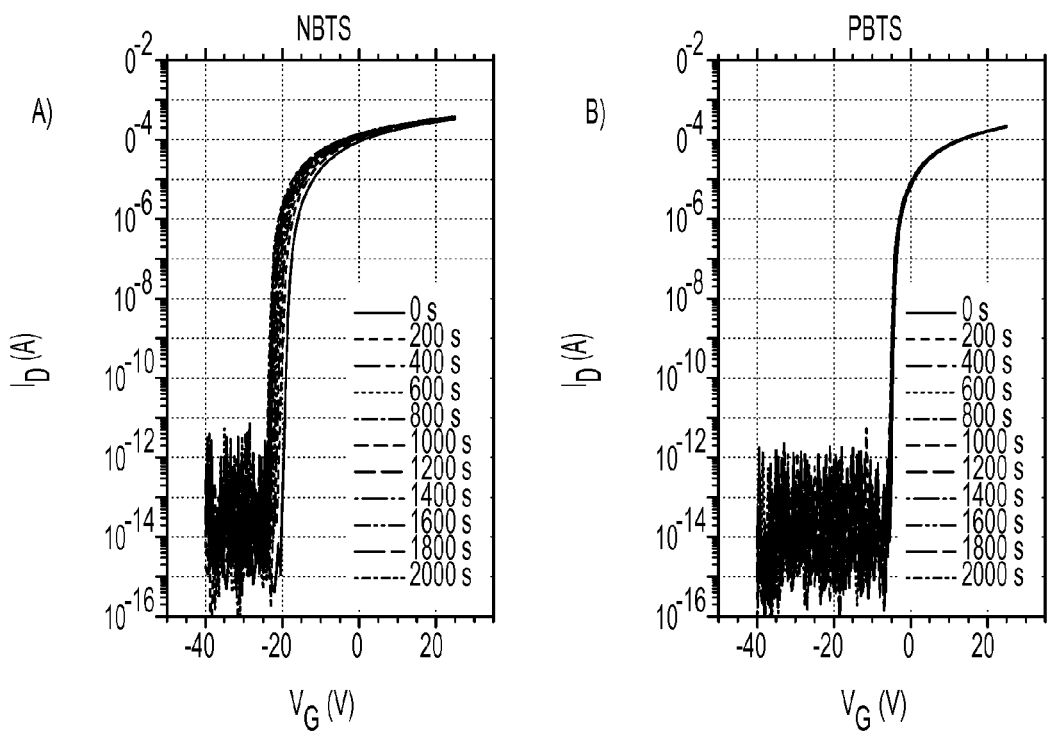
FIG. 13 shows the transfer characteristics of a comparative IGZO TFT having the structure shown in FIG. 1 and a passivation layer composed of a photocrosslinkable polymer only, further having a top self-assembled monolayer composed of an aliphatic phosphonic acid.
Figure 14:
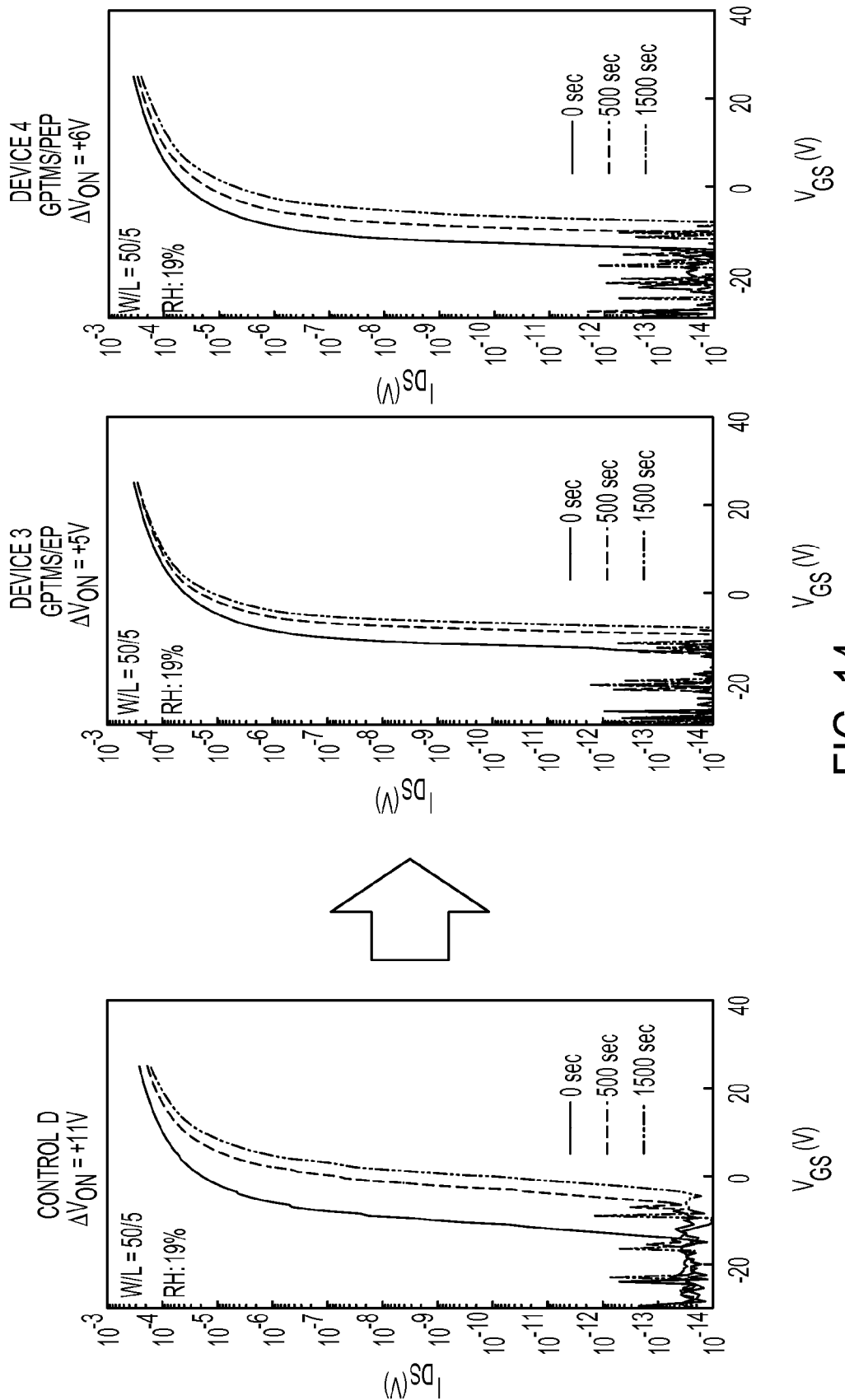
FIG. 14 compares the transfer characteristics of two IGZO transistor devices having passivation layers according to the present teachings (Device 3 and Device 4) against a control device (Device D).

To address such photon-accelerated negative bias instability involving subgap states creation, certain embodiments of the coating material can include a stabilizing agent having a spacer group that comprises (entirely or in part) a π-conjugated core for tuning the energy of the HOMO (highest occupied molecular orbital) and LUMO (lowest unoccupied molecular orbital), and therefore the band gap, of the stabilizing agent. By tuning the HOMO of the stabilizing agent above the VBM state energy (as shown in FIG. 6), the present stabilizing agent can reduce the negative bias stress by trapping the photo-excited holes near the back channel surface.

Generic examples of stabilizing agents including a spacer group (SG) comprising a π-conjugated core can include:

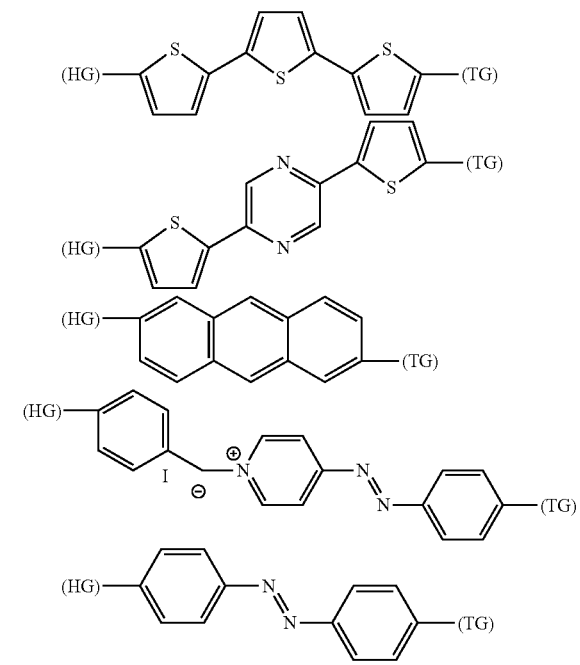

wherein:

HG is selected from the group consisting of a) -L-Y—Si(R')$_3$, b) -L-Y—P(O)(OR$^2$)$_2$, c) -L-Y—COOH, d) -L-Y—NCO, and e) -L-Y—CNO; wherein R$^1$ and R$^2$, at each occurrence, independently are selected from the group consisting of a) H, b) a halogen, c) a $C_{1-20}$ alkoxy group and d) a $C_{1-20}$ alkyl group; L is selected from the group consisting of a) —O—, b) —C(O)—, c) —OC(O)—, d) —C(O)O—, e) —NR$^4$—, f) —C(O)NR$^4$—, g) —NR$^4$C(O)—, and h) a covalent bond, wherein R$^4$ is selected from the group consisting of a) H, b) a $C_{1-20}$ alkyl group, c) a —$C_{1-20}$ alkyl —NH$_2$; and Y is selected from the group consisting of a divalent alkyl group, a divalent $C_{6-14}$ aryl group, and a covalent bond; and TG has the formula:

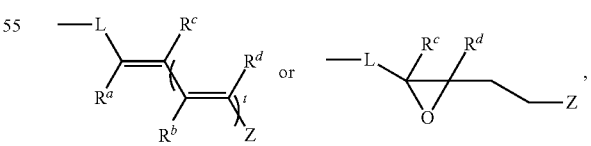

wherein:

L is selected from the group consisting of a) —O—, b) —C(O)—, c) —OC(O)—, d) —C(O)O—, e) —NR$^4$—, f) —C(O)NR$^4$—, g) —NR$^4$C(O)—, and h) a covalent bond, wherein R$^4$ is selected from the group consisting of a) H, b) a $C_{1-20}$ alkyl group, c) a —$C_{1-20}$ alkyl —NH$_2$;

Z is selected from the group consisting of a $C_{1-10}$ alkyl group, a $C_{1-10}$ haloalkyl group, a substituted or unsubstituted $C_{6-14}$ aryl group, and a substituted or unsubstituted 5-14 membered heteroaryl group;

$R^a$ and $R^b$ independently are selected from the group consisting of H, F, Cl, CN, $CH_3$, and $CF_3$;

$R^c$ and $R^d$ independently are selected from the group consisting of H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group; and t is 0 or 1.

Specific examples of stabilizing agents including a spacer group (SG) comprising a π-conjugated core can include:

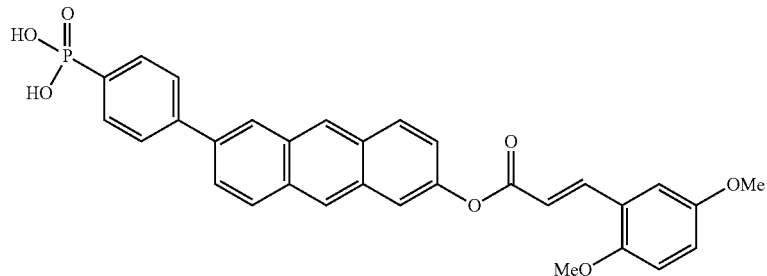

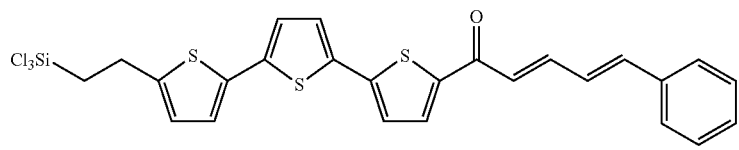

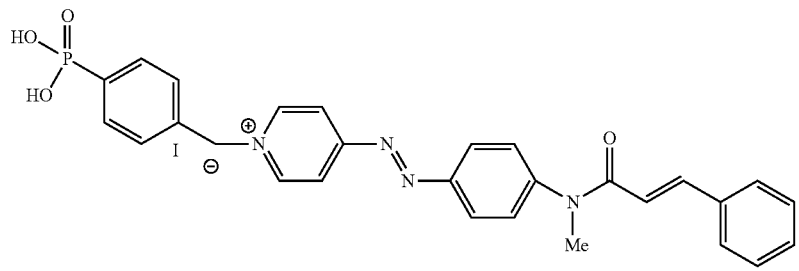

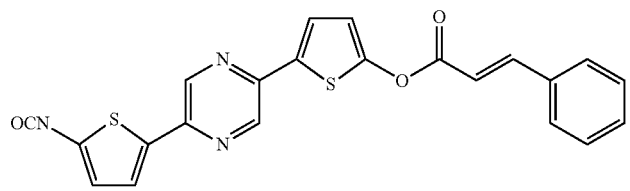

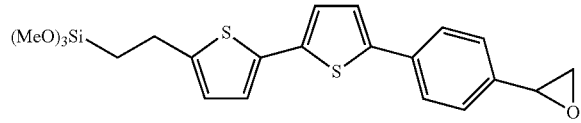

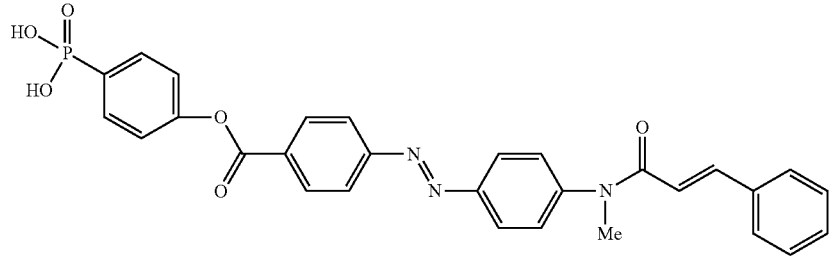

Stabilizing agents according to the present teachings can be prepared according to the following synthetic schemes:
1)
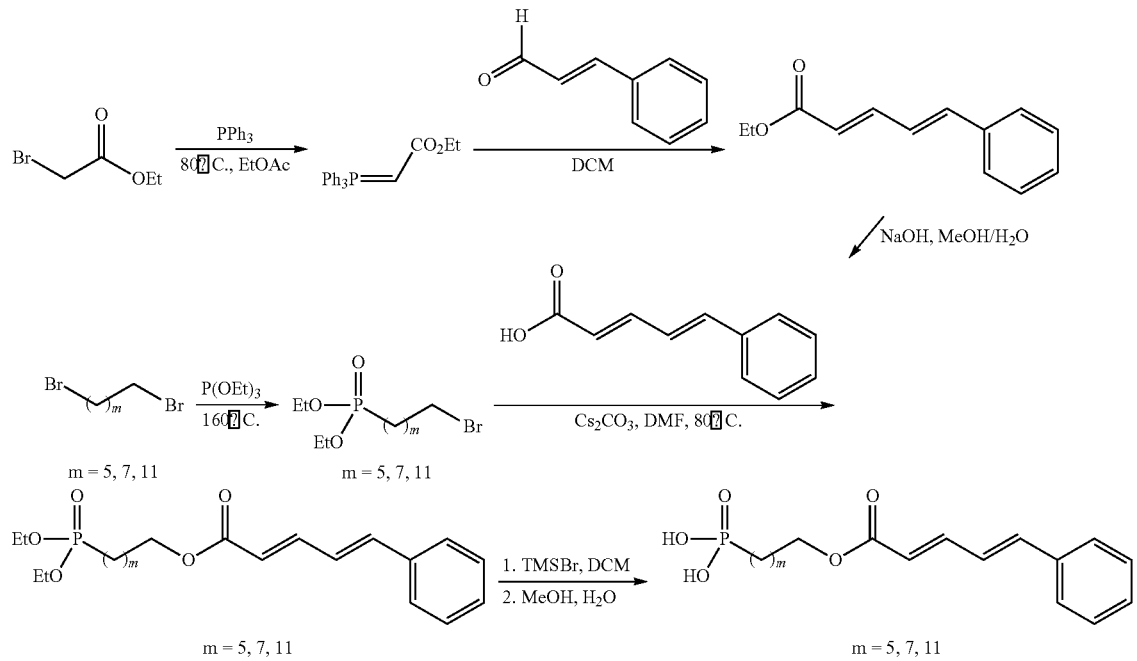
2)
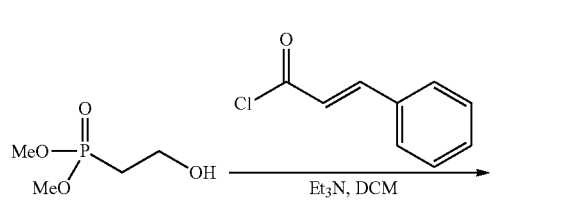
3)
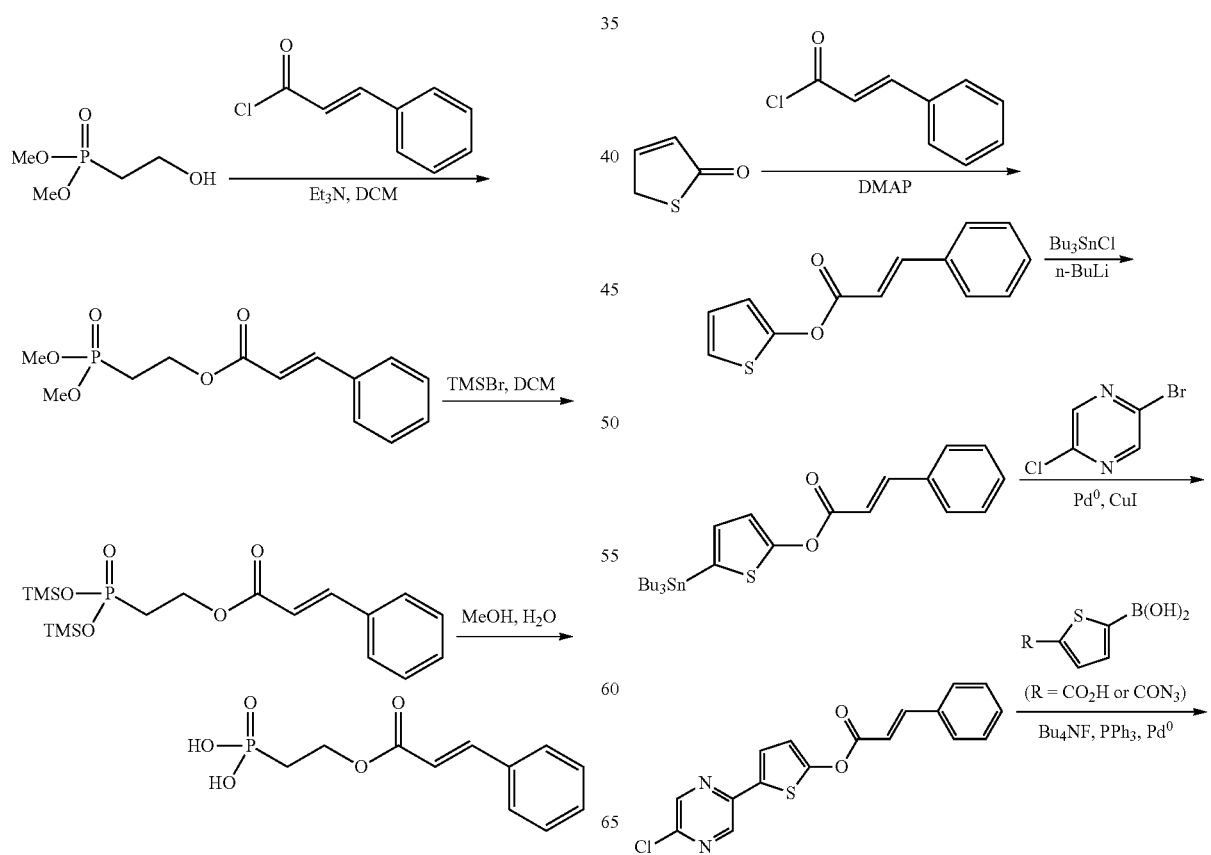

-continued
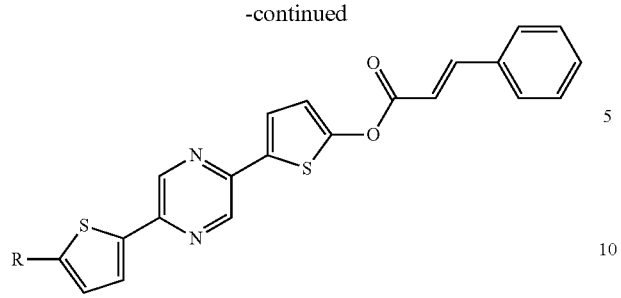
4)
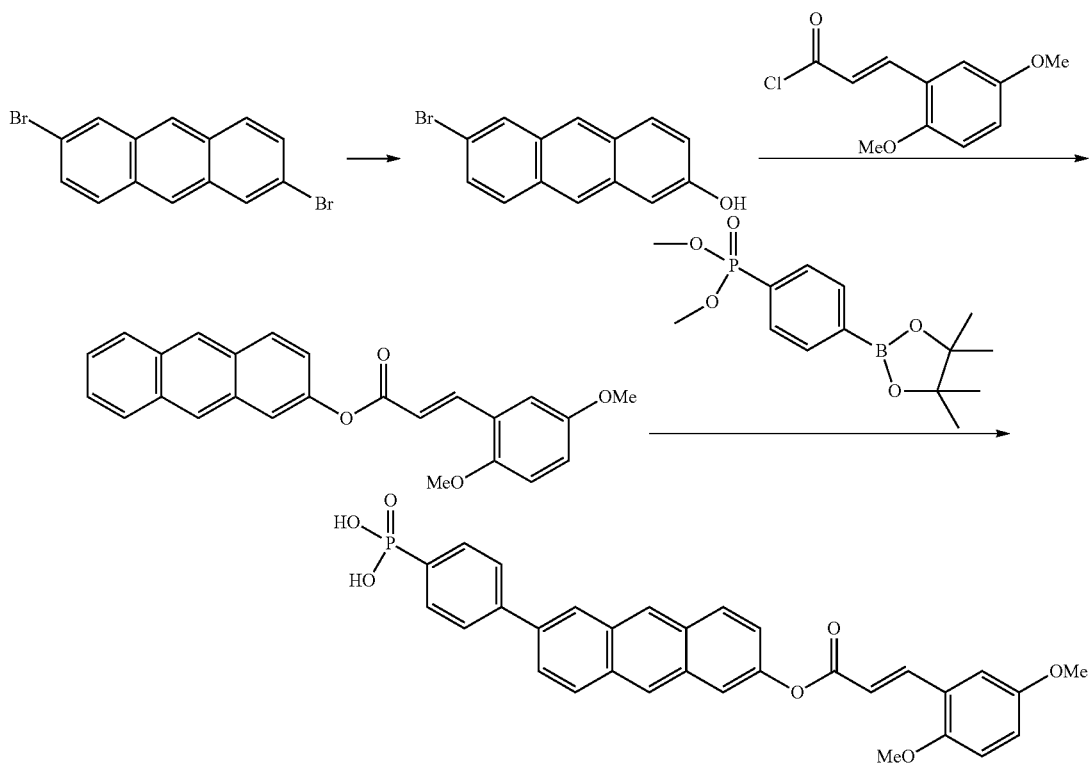
5)
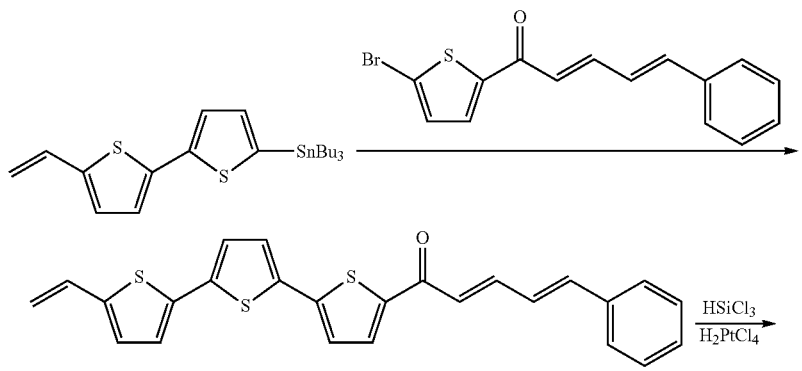

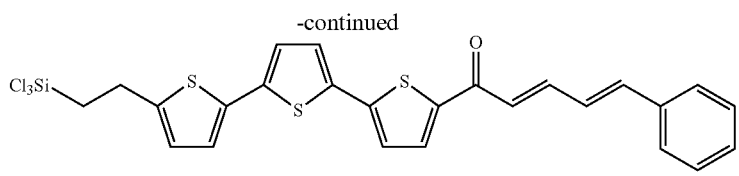
6)
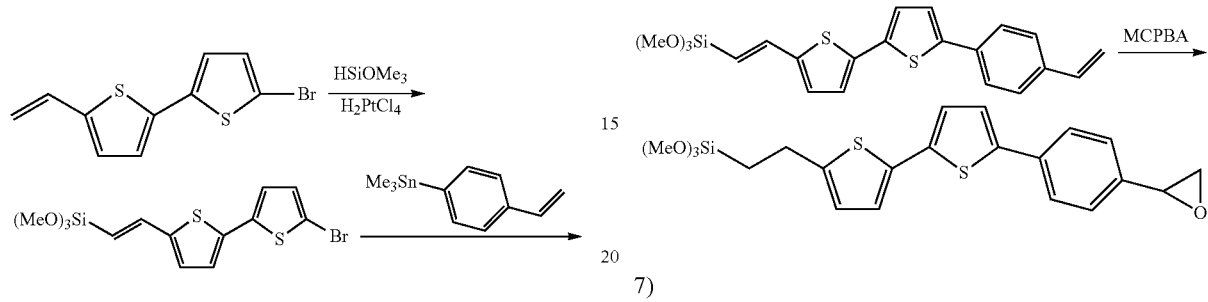
7)
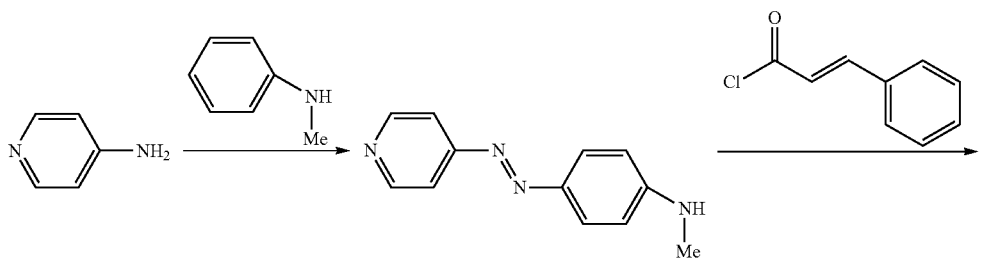
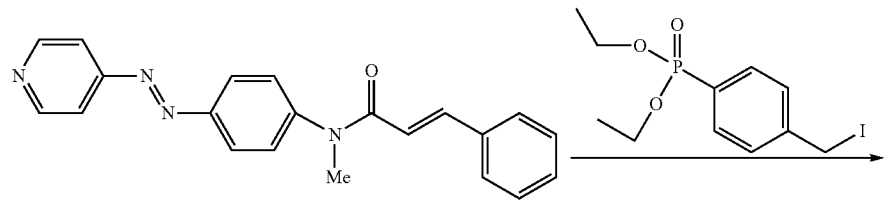
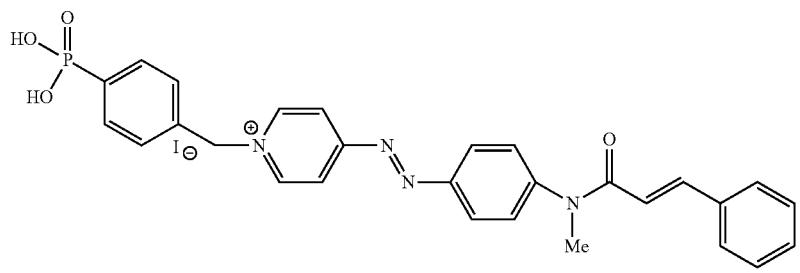
8)
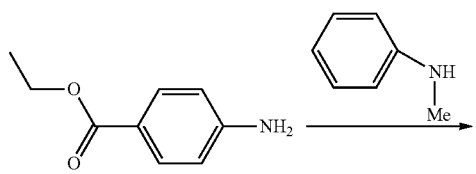

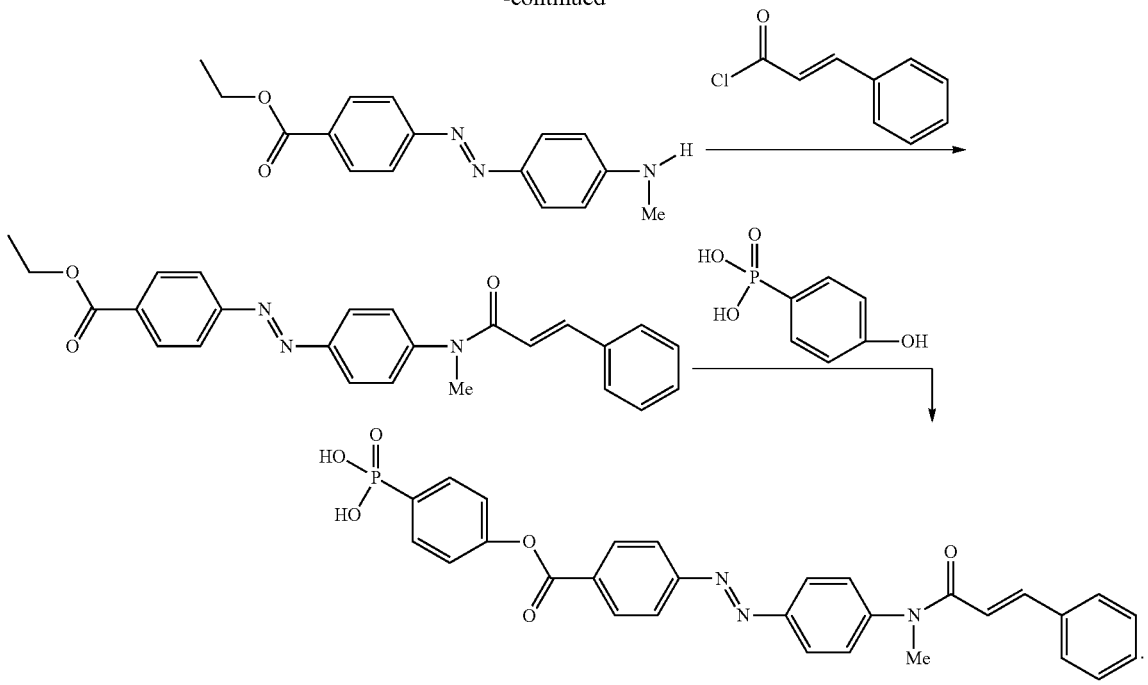

A metal oxide thin film transistor having a coating material according to the present teachings can be fabricated as follows. Generally, the fabrication method involves forming a gate electrode over a substrate, forming a gate dielectric over the gate electrode, forming a metal oxide thin film semiconductor over the gate dielectric, forming a source electrode and a drain electrode over the metal oxide thin film semiconductor and defining a channel between the source electrode and the drain electrode. Referring to FIG. 1, the coating material can be formed over the channel and the source electrode and the drain electrode (as a passivation layer), over the substrate (as an optional surface modifier layer), and/or over the gate (as a gate dielectric layer).

A coating layer according to the present teachings can be prepared by dissolving a polymer with a stabilizing agent as described herein in an organic solvent to provide a coating composition, depositing the composition onto a substrate (e.g., overlying the source and drain electrodes and enclosing the metal oxide channel area), and optionally performing at least one curing step to form a coating layer. The curing step can be by radiation and/or by heat. Further, the curing process can involve multiple curing steps, where the two or more curing steps can be performed at identical or different temperatures/wavelengths. For example, in embodiments where the coating material is formed underneath the metal oxide layer, a first curing step can be performed at a lower temperature and/or offset wavelength such that the curing dose is not sufficient to crosslink all the stabilizing agents with the polymer within the coating material. Subsequent to the deposition of the metal oxide layer, a second curing step can be performed at a higher temperature and/or shorter wavelength to induce any uncrosslinked stabilizing agents to migrate to the coating/metal oxide interface forming an upper monolayer within the coating material. The coating layer can have a thickness in the range of about 0.2 µm to about 5 µm. Various solution-phase deposition methods known in the art can be used to deposit the coating composition; alternatively, the polymer can be deposited by a physical vapor technique. In various embodiments, the solution-phase process can be selected from spin-coating, slot coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique can be dependent on the spin-coating rate, the concentration of the solution, as well as the solvent used. Printing can be performed, for example, with a rotogravure printing press, a flexoprinting press, pad printing, screen printing or an ink jet printer. The thickness of the resulting film as processed by these printing methods can be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity. For non-contact printing techniques such as inkjet printing, the solubility requirement generally can be less stringent and a solubility range as low as about 1-4 mg/ml can suffice. For gravure printing, a higher solubility range may be necessary, often in the range of about 50-100 mg/ml. Other contact printing techniques such as screen-printing and flexo printing can require even higher solubility ranges, for example, about 100-1000 mg/ml.

In other embodiments, a self-assembled monolayer (SAM) composed of solely the stabilizing agent described herein (i.e., without the polymer) can be deposited on the substrate first. The SAM can be deposited by dipping, spin-coating, vapor coating, or thermal evaporation. Subsequently, a coating composition comprising the polymer and optionally an additional amount of the stabilizing agent can be deposited, followed by curing as described above.

In certain embodiments, the coating material according to the present teachings can be used as a sublayer in conjunction with one or more sublayers composed of an inorganic material (e.g., $SiO_2$ or $SiN_x$). The inorganic sublayer typically has a thickness no greater than about 200 nm so that the metal oxide thin film transistor as a whole can remain flexible if fabricated on a flexible substrate.

FIGS. 7 and 8 illustrate how to fabricate a metal oxide transistor having a coating material (specifically, a passivation layer) according to certain embodiments of the present teachings. Referring to FIG. 7, a passivation layer can be prepared by depositing a coating formulation (e.g., a passivation formulation) that includes both the polymer and the stabilizing agent over the channel and the source electrode and the drain electrode. The coated device then can be subjected to thermal and/or UV annealing to induce crosslinking between the polymer and the stabilizing agent. Referring to FIG. 8, a passivation layer can be prepared by depositing the stabilizing agent in a first coating composition, then depositing the polymer (optionally with an additional amount of the stabilizing agent) in a second coating composition. The coated device then can be subjected to thermal and/or UV annealing to induce crosslinking between the polymer and the stabilizing agent as in the other embodiment. In each case, the polymer and/or the stabilizing agent can be dispersed or dissolved together or separately in a solvent or solvent mixture.

A large variety of substrates, including conventional glass substrates, can be used to fabricate a metal oxide thin film transistor according to the present teachings. For flexible device applications, flexible substrates including polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof can be used. Other possible substrates include quartz, VYCOR®, and soda lime glass.

An electrically conducting film can be formed on the substrate and patterned to form the gate electrode. For example, a metallic film can be deposited using deposition techniques such as electrodeposition, vaporization, sputtering, electroplating, coating, laser ablation and offset printing, from metal or metal alloy including copper (Cu), aluminum (Al), gold (Au), silver (Ag), platinum (Pt), palladium (Pd), nickel (Ni), titanium (Ti), and/or molybdenum (Mo), an electrically conductive oxide such as indium tin oxide (ITO), or an electrically conductive polymer such as polyethylenethioxythiophene (PEDOT). In certain embodiments, the metallic film can be deposited by physical vapor deposition such as thermal evaporation or radiofrequency or e-beam sputtering. The electrically conducting film can be a single layer or it can have a layered structure. For example, the gate electrode can be a layered film containing titanium and aluminum, e.g., a Ti/Al/Ti layered film. In another embodiment, the source and drain electrodes can be a layered film containing molybdenum and copper, e.g., a Mo/Cu/Mo layered film. Alternatively, it can be a layered film containing titanium, molybdenum, and aluminum, e.g., a Ti/Mo/Al layered film. The patterning of the gate electrode can be achieved by depositing the metallic film through a shadow mask, or by photolithography (with the use of a photoresist pattern film and an etching step).

The gate dielectric (insulating) layer can be an inorganic material, an organic material, or a hybrid inorganic/organic material. The thickness of the gate dielectric typically ranges from about 10 nm to about 5000 nm, preferably from about 50 nm to about 1000 nm, and more preferably from about 100 nm to about 400 nm. Examples of inorganic dielectric materials include various oxides (e.g., $SiO_2$, $Al_2O_3$, $HfO_2$) and nitrides (e.g., $Si_3N_4$) and can be deposited via conventional methods such as thermal evaporation and various physical and chemical vapor deposition techniques (e.g., sputtering, plasma-enhanced chemical vapor deposition (PECVD), atomic layer deposition (ALD), pulsed laser deposition (PLD), and ion-assisted deposition (IAD)). In certain embodiments, a silicon nitride ($SiN_x$) film can be formed by PECVD as the gate dielectric. In other embodiments, a silicon oxide ($SiO_x$) film can be used in place of the $SiN_x$ film. Alternatively, a multilayer film comprising a $SiO_x$ film and a $SiN_x$ film can be used. Solution-processed electrically insulating metal oxide thin films can be prepared as described in International Application No. PCT/US12/23042, the disclosure of which is incorporated by reference herein in its entirety. Examples of organic dielectric materials include various polymeric materials (e.g., polycarbonate, polyester, polystyrene, polyhaloethylene, polyacrylate). Examples of hybrid inorganic/organic dielectric materials include those described in U.S. Pat. No. 8,017,458 and U.S. patent application Ser. No. 13/477,030, the disclosure of each of which is incorporated by reference herein in its entirety. In particular embodiments, the gate dielectric can be prepared from polymers described in U.S. Provisional Patent Application Nos. 61/596,217 and 61/586,999, International Publication No. WO 2010/136385, U.S. Patent Application Publication Nos. 2011/0024729, 2011/0215334, and 2011/0175089, and U.S. Pat. Nos. 7,605,394, 8,093,588, and 7,981,989, the disclosure of each of which is incorporated by reference herein in its entirety. The polymers described therein can be deposited from a solution-phase process selected from spin-coating, slot coating, die coating, printing (e.g., inkjet printing, screen printing, pad printing, offset printing, gravure printing, flexographic printing, lithographic printing, mass-printing and the like), spray coating, electrospray coating, drop casting, dip coating, and blade coating; and optionally cured (by thermal annealing and/or photocrosslinking) to improve its dielectric properties. Instead of using solution-phase process, the dielectric polymers also can be deposited by physical or chemical vapor deposition methods.

Examples of metal oxide semiconductors include indium oxide ($In_2O_3$), indium zinc oxide (IZO), zinc tin oxide (ZTO), indium gallium oxide (IGO), indium-gallium-zinc oxide (IGZO), indium tin zinc oxide (ITZO), tin oxide ($SnO_2$), and zinc oxide (ZnO). Examples of metal chalcogenide semiconductors include cadmium sulfide (CdS), cadmium selenide (CdSe), and the like. Solution-phase processed metal oxides and metal chalcogenides are described in, for example, U.S. Pat. No. 8,017,458 and International Application No. PCT/US12/23042, the disclosure of each of which is incorporated by reference herein in its entirety. Alternatively, the semiconductor layer can comprise a vapor-phase processed (e.g., sputtered) metal oxide or chalcogenide. In preferred embodiments, the metal oxide thin film semiconductor comprises a metal oxide selected from IZO, ZTO, IGO, and IGZO. In particular embodiments, the metal oxide thin film semiconductor comprises IGZO sputtered onto an organic gate insulating (dielectric) layer. The thickness of the metal oxide thin film semiconductor can range from about 50 nm to about 500 nm. The metal oxide thin film semiconductor typically is patterned (e.g., by photolithography) following deposition.

Similar to the gate electrode, an electrically conducting film can be formed on the substrate and patterned to form the source and drain electrodes. For example, the electrically conducting film can be deposited through a mask, or can be deposited then etched to define a channel area between the source and drain electrodes. Suitable deposition techniques include electrodeposition, vaporization, sputtering, electroplating, coating, laser ablation and offset printing, from metal or metal alloy including copper (Cu), aluminum (Al), gold (Au), silver (Ag), platinum (Pt), palladium (Pd), nickel (Ni), titanium (Ti), and/or molybdenum (Mo), an electrically conductive oxide such as indium tin oxide (ITO), or an electrically conductive polymer such as polyethylenethioxythiophene (PEDOT). In certain embodiments, the metallic film can be deposited by physical vapor deposition such as thermal evaporation or radiofrequency or e-beam sputtering. The electrically conducting film can be a single layer or it can have a layered structure. For example, the source and drain electrodes can be a layered film containing titanium and aluminum, e.g., a Ti/Al/Ti layered film. Alternatively, the source and drain electrodes can be a layered film containing titanium, molybdenum, and aluminum, e.g., a Ti/Mo/Al layered film. In another embodiment, the source and drain electrodes can be a layered film containing molybdenum and copper, e.g., a Mo/Cu/Mo layered film. In yet another embodiment, the source and drain electrodes can be a layered film containing titanium, aluminum, and molybdenum, e.g., a Ti/Al/Ti/Mo layered film, where the Mo sublayer is in contact with the metal oxide thin film semiconductor layer. In embodiments where the patterning is realized by etching, a surface portion of the channel area of the metal oxide thin film semiconductor layer also can be etched away. Accordingly, in some embodiments, an etch-stop layer may be formed prior to the deposition of the electrically conducting film to be patterned as the source and drain electrodes. For example, the etch-stop layer can be prepared from a polymer described in U.S. Provisional Patent Application Nos. 61/596,217 and 61/586,999, the disclosure of each of which is incorporated by reference herein in its entirety.

The following examples are provided to illustrate further and to facilitate the understanding of the present teachings and are not in any way intended to limit the invention.

Example 1

Bias Temperature Stress Test

Bottom-gate top-contact IGZO transistor devices were fabricated on a glass substrate with a 250-nm thick Ti/Al/Ti gate metal electrode deposited by sputtering. A 200-nm thick silicon nitride layer (capacitance of about 33 nF/cm$^2$) was then deposited as a gate dielectric by plasma-enhance chemical vapor deposition. The a-IGZO channel was deposited by sputtering using a polycrystalline IGZO target, yielding a film thickness of about 50 nm. Finally, source and drain electrodes were deposited via sputtering a 250-nm thick Ti/Al/Ti layer and subsequent patterning via photolithography and wet etching. The channel width (W) and length (L) of the TFTs were 20 μm and 5 μm, respectively.

A passivation layer according to the present teachings were prepared from a composition including a photocrosslinkable polymer and a photocrosslinkable phosphonic acid amphiphilic agent (either at 6% (device 1) or 10% (device 2) by weight of the photocrosslinkable polymer) in an organic solvent. The concentration of the photocrosslinkable polymer can be about 100 mg/mL. All the components were stirred at 800 rpm for 1 h in a closed, amber vial. A 500-nm thick passivation layer film was spin-coated on the IGZO devices by spinning the prepared solutions at 1000 rpm for 90s. The samples were baked immediately at 100° C. for 60 s, and then cured with a flood UV-A exposure of 3000 mJ/cm$^2$ using a Model 2000 Dymax light curing system. The samples were then baked at 220° C. for 1 h in a tube furnace under atmosphere. Three different comparative devices were fabricated: (a) comparative device A having a coating layer composed of the photocrosslinkable polymer only (i.e., without the photocrosslinkable phosphonic acid amphiphilic agent), (b) comparative device B having a coating layer composed of the photocrosslinkable polymer only and a top self-assembled monolayer prepared by soaking comparative device A in a solution of the photocrosslinkable phosphonic acid amphiphilic agent; and (c) comparative device C having a coating layer composed of the photocrosslinkable polymer only and a top self-assembled monolayer prepared by soaking comparative device A in a solution of an aliphatic phosphonic acid.

A different passivation layer according to the present teachings was prepared from a thermally curable silane amphiphilic agent as follows. Hydrochloric acid (2.5 ml, 0.1 M) was added to a 50 ml solution of 5% (v/v) GPTMS in ethanol and stirred at 600 rpm for 95 min. Then it was mixed with a solution of 2.5 ml 0.1 M HCl in 50 ml ethanol to give a passivation material formulation for surface treatment of the IGZO surface. For the soaking process, the IGZO devices were soaked in the above formulation for 60 min, rinsed with pure ethanol, dried in air and baked at 120° C. for 60 min. For the spin coating process, the above formulation was spun coated on IGZO substrates at 1000 rpm for 30 s after a 10 s wait and then baked at 120° C. for 60 min. After the surface treatment, either 100-20 mg/ml of epoxy(oxirane)-base small molecule EP1 solution in cyclopentanone or 50-10 mg/ml of polymer PEP1 solution in cyclopentanone was spun coated at 800-2500 rpm for 60 s and then soft baked at 120° C. for 2 min. The resulting film thickness varied from about 300 nm to about 3 microns depending on the spin-rate and concentration. The devices were finally baked at 200° C. for 15 min to give a thin film of thickness of ~110 nm for EP1 layer or of ~90 nm for PEP 1 layer. The devices were then subject to characterization. Three different devices were fabricated: (a) comparative device D as a control without any treatment, (b) device 3 having a coating of GPTMS prepared by soaking and a spin-coated layer of EP1 (c) device 4 having a coating of GPTMS prepared by spin-coating and a spin-coated layer of EP1. Spin-coated devices performed similarly.

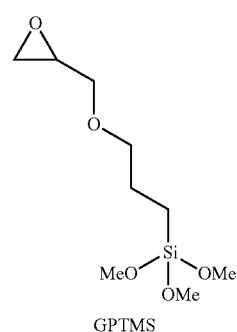

GPTMS

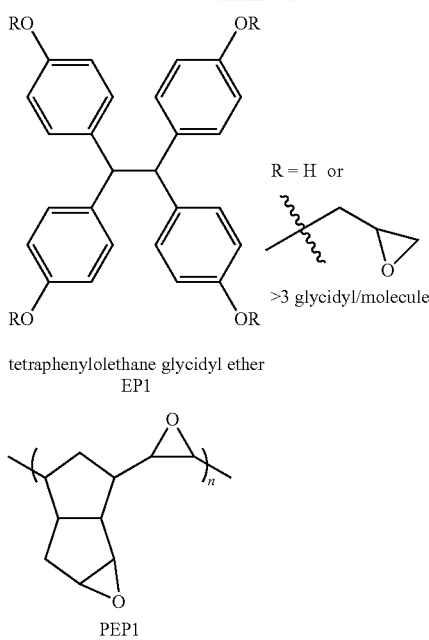

tetraphenylolethane glycidyl ether
EP1

R = H or >3 glycidyl/molecule

PEP1

A Keithley 4200 semiconductor parameter analyzer was used to monitor all electrical characteristics in the dark. The samples were heated to 80° C. by placing it on a heated stage during the electrical characteristics measurements. The initial $I_D$-$V_G$ transfer curve using $V_{SD}$=+10 V and +0.1 V was measured between $V_{GS}$=–40 and +25 V (0.5 V intervals) before the bias stress was applied, which established the pre-stressed state. The data from the $I_D$-$V_G$ transfer curve and $V_{SD}$=+0.1 V was used to calculate the device mobility in the linear regime. Constant-negative-voltage-bias temperature stress testing was accomplished over a total period of 2000 s (in 200 s intervals) by holding $V_{GS}$=–30 V and $V_{SD}$=0 V. Constant-positive-voltage-bias temperature stress testing held the $V_{GS}$=+30 V and $V_{SD}$=0 V for a total of 2000 s. A $I_D$-$V_G$ transfer curve using $V_{SD}$=+10 V and $V_{GS}$=–40 and +25 V (0.5 V intervals) was measured immediately after each 200 s stressing period to establish the post-stressed states.

Transfer characteristics of the tested devices are shown in FIGS. 9-14. Table 1 below summarizes the mobility in the linear region and threshold voltage shifts of the tested devices. Generally, a consistent device mobility and threshold voltage shift of about 4 V or less is desired, where a threshold voltage shift of greater than about 4V is unacceptable.

TABLE 1

| Device | $\mu_{lin}$ (cm$^2$/V · s) | NBTS (10 days) @80° C./2000s ΔVth (V) | PBTS (10 days) @80° C./(s) ΔVth (V) |
|---|---|---|---|
| Device 1 | 6.1 | −4 | +1 (2000s) |
| Device 2 | 5.8 | −3 | +2 (2000s) |
| Comparative Device A | 5.8 | −16 | +1 (2000s) |
| Comparative Device B | 5.8 | −16 | +2 (2000s) |
| Comparative Device C | 5.8 | −7 | 0 (2000s) |
| Device 3 | 5.5 | — | +5 (1500s) |
| Device 4 | 5.6 | — | +6 (1500s) |
| Comparative Device D | 5.2 | — | +11 (1500s) |

Example 2

Adhesion Test

Coating films (500-nm thick) according to the present teachings was prepared from a solution comprising a photocrosslinkable polymer (100 mg) and a photocrosslinkable phosphonic acid amphiphilic agent (at 6% by weight of the photocrosslinkable polymer) in an organic solvent (1 mL), which was spin-coated on ITO substrates by spinning the prepared solution at 1000 rpm for 90 s. The samples were baked immediately at 100° C. for 60 s, and then cured with a flood UV-A exposure of 3000 mJ/cm$^2$ using a Model 2000 Dymax light curing system. The samples were then baked at 220° C. for 1 h in a tube furnace under atmosphere.

The samples were placed on a rigid, flat surface and the edges secured using tape. Uniform pressure was applied on the cutting tool to make 6 parallel cuts 1 mm apart that penetrated to the substrate surface. This operation was repeated, making further parallel cuts of equal number, crossing the original cuts at 90° to them so that a lattice pattern was formed. Adhesive tape (3M 600 or TQC tape) was placed over the lattice in a direction parallel to one set of cuts and smoothed into place with a finger over the area of the lattice and for a distance of at least 20 mm beyond. Five minutes after the tape had been applied it was removed by grasping the free end and pulling it off steadily at an angle which is as close as possible to 60°. The cut area was examined closely from multiple angles and compared to classification table provided in ASTM D3359 to assign one of six classifications (FIG. 15). This process was repeated at least three times. All coating films according to the present teachings satisfied the 5B classification, demonstrating excellent adhesion to the ITO substrates.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A metal oxide thin film transistor comprising a substrate, a gate electrode over the substrate, a gate dielectric over the gate electrode, a metal oxide thin film semiconductor over the gate dielectric, a source electrode and a drain electrode over the metal oxide thin film semiconductor, wherein the source electrode and the drain electrode is separated by a channel area comprising an exposed surface of the metal oxide thin film semiconductor, and a coating material over the channel area and the source and drain electrodes, wherein the coating material comprises a first component comprising a polymerizable component, a crosslinkable component, and/or a polymer, and a second component comprising a stabilizing agent capable of facilitating desorption of one or more low-molecular weight molecules from the channel and having the formula:

HG-SG-TG, wherein:

HG is selected from the group consisting of a) —Si(R$^1$)$_3$, b) —P(O)(OR$^2$)$_2$, c) —COOH, d) —NCO, and e) —CNO; wherein R$^1$ and R$^2$, at each occurrence, independently are selected from the group consisting of a) H, b) a halogen, c) a $C_{1-20}$ alkoxy group and d) a $C_{1-20}$ alkyl group;

SG is selected from the group consisting of a) a covalent bond, b) a divalent $C_{1-20}$ alkyl group, c) a divalent $C_{2-20}$ alkenyl group, d) a divalent $C_{2-20}$ alkynyl group, e) a divalent $C_{1-20}$ alkoxy group, f) a divalent $C_{1-20}$ alkylthio group, g) a divalent $C_{1-20}$ haloalkyl group, h) a divalent $C_{3-14}$ cycloalkyl group, i) a divalent $C_{6-14}$ aryl group, j) a divalent 3-14 membered cycloheteroalkyl group, k) a divalent 5-14 membered heteroaryl group, l) a divalent oxirane, and m) a combination of any two or more of a)-m), wherein each of the $C_{1-20}$ alkyl group, the $C_{2-20}$ alkenyl group, the $C_{2-20}$ alkynyl group, the $C_{1-20}$ alkoxy group, the $C_{1-20}$ alkylthio group, the $C_{3-14}$ cycloalkyl group, the $C_{6-14}$ aryl group, the 3-14 membered cycloheteroalkyl group, and the 5-14 membered heteroaryl group optionally is substituted with 1-5 groups selected from the group consisting of halogen, —CN, and a $C_{1-20}$ haloalkyl group; and TG is selected from the group consisting of a) H, b) halogen, c) —CN, d) —NO$_2$, e) —OR$^3$, f) —SH, g) —N(R$^4$)$_2$, h) —CHO, i) —C(O)R$^3$, j) —C(O)OR$^3$, k) —C(O)N(R$^4$)$_2$, l) a $C_{1-20}$ alkyl group, m) a $C_{1-20}$ haloalkyl group, n) $C_{2-20}$ alkenyl group, o) a $C_{2-20}$ alkynyl group, p) a $C_{6-14}$ aryl group, q) an oxiranyl group and r) a 5-14 membered heteroaryl group, wherein R$^3$ independently is selected from the group consisting of a) H, b) a $C_{1-20}$ alkyl group, and c) a $C_{1-20}$ haloalkyl group; and R$^4$, at each occurrence, independently is selected from the group consisting of a) H, b) a $C_{1-20}$ alkyl group, c) a —C$_{1-20}$ alkyl —NH$_2$; and each of the $C_{6-14}$ aryl group and the 5-14 membered heteroaryl group optionally is substituted with 1-5 groups selected from the group consisting of a) halogen, b) a $C_{1-20}$ alkyl group, c) a $C_{1-20}$ haloalkyl group and d) a $C_{1-20}$ alkoxy group.

2. The metal oxide thin film transistor of claim 1, wherein the metal oxide thin film semiconductor comprises IGZO.

3. The metal oxide thin film transistor of claim 2, wherein the metal oxide thin film semiconductor is formed by a physical vapor deposition method.

4. The metal oxide thin film transistor of claim 2, wherein the metal oxide thin film semiconductor is formed by a solution-phase deposition method.

5. The metal oxide thin film transistor of claim 1, wherein the stabilizing agent is selected from the group consisting of a silane, a cyanate, and an isocyanate.

6. The metal oxide thin film transistor of claim 5, wherein the silane is selected from the group consisting of a trichlorosilane, a trimethoxysilane, and a triethoxysilane.

7. The metal oxide thin film transistor of claim 1, wherein the stabilizing agent is a phosphonic acid.

8. The metal oxide thin film transistor of claim 1, wherein the stabilizing agent comprises a spacer group (SG) comprising a hydrocarbon.

9. The metal oxide thin film transistor of claim 1, wherein the gate dielectric comprises silicon oxide or silicon nitride.

10. The metal oxide thin film transistor of claim 1, wherein the gate dielectric comprises an organic material.

11. The metal oxide thin film transistor of claim 1, wherein the substrate comprises a flexible plastic substrate.

12. A metal oxide thin film transistor comprising a substrate, a gate electrode over the substrate, a gate dielectric over the gate electrode, a metal oxide thin film semiconductor over the gate dielectric, a source electrode and a drain electrode over the metal oxide thin film semiconductor, wherein the source electrode and the drain electrode is separated by a channel area comprising an exposed surface of the metal oxide thin film semiconductor, and a coating material over the channel area and the source and drain electrodes, wherein the coating material comprises a first component comprising a polymerizable component, a crosslinkable component, and/or a polymer, and a second component comprising a stabilizing agent capable of facilitating desorption of one or more low-molecular weight molecules from the channel and having formula:

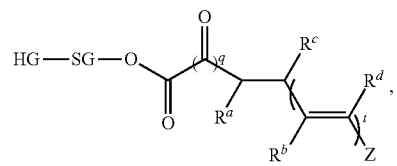

wherein:

HG is selected from the group consisting of a) —Si(R$^1$)$_3$, b) —P(O)(OR$^2$)$_2$, c) —COOH, d) —NCO, and e) —CNO; wherein R$^1$ and R$^2$, at each occurrence, independently is selected from the group consisting of a) H, b) a halogen, c) a $C_{1-20}$ alkoxy group and d) a $C_{1-20}$ alkyl group;

SG is a divalent $C_{1-20}$ alkyl group;

Z is selected from the group consisting of a $C_{1-10}$ alkyl group, a $C_{1-10}$ haloalkyl group, a substituted or unsubstituted $C_{6-14}$ aryl group, and a substituted or unsubstituted 5-14 membered heteroaryl group;

R$^a$ and R$^b$ independently are selected from the group consisting of H, F, Cl, CN, CH$_3$, and CF$_3$;

R$^c$ and R$^d$ independently are selected from the group consisting of H, a $C_{1-10}$ alkyl group, a $C_{1-10}$ haloalkyl group, a substituted or unsubstituted $C_{6-14}$ aryl group, and a substituted or unsubstituted 5-14 membered heteroaryl group; and q and t independently are 0 or 1.

13. A metal oxide thin film transistor comprising a substrate, a gate electrode over the substrate, a gate dielectric over the gate electrode, a metal oxide thin film semiconductor over the gate dielectric, a source electrode and a drain electrode over the metal oxide thin film semiconductor, wherein the source electrode and the drain electrode is separated by a channel area comprising an exposed surface of the metal oxide thin film semiconductor, and a coating material over the channel area and the source and drain electrodes, wherein the coating material comprises a first component comprising a polymerizable component, a crosslinkable component, and/or a polymer, and a second component comprising n agent selected from the group consisting of:

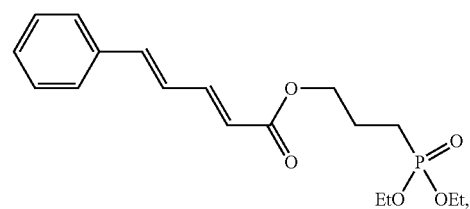

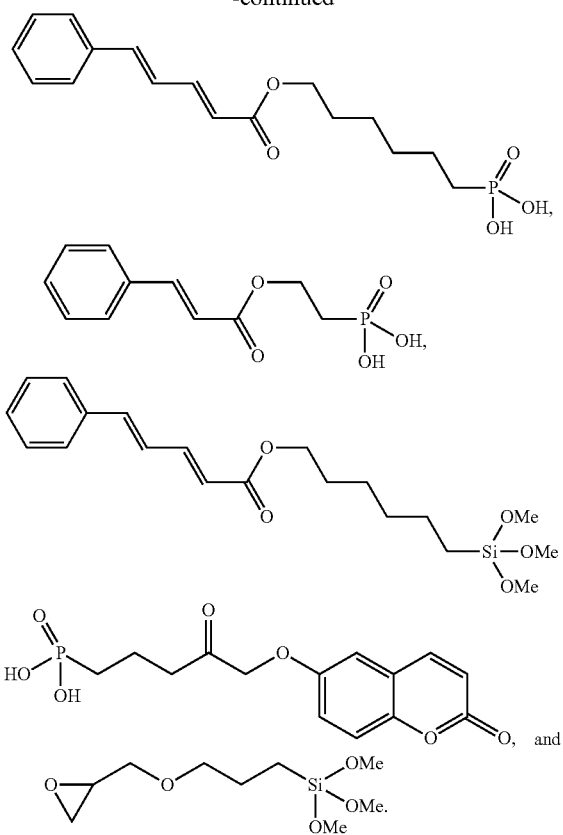

14. A metal oxide thin film transistor comprising a substrate, a gate electrode over the substrate, a gate dielectric over the gate electrode, a metal oxide thin film semiconductor over the gate dielectric, a source electrode and a drain electrode over the metal oxide thin film semiconductor, wherein the source electrode and the drain electrode is separated by a channel area comprising an exposed surface of the metal oxide thin film semiconductor, and a coating material over the channel area and the source and drain electrodes, wherein the coating material comprises a first component comprising a polymerizable component, a crosslinkable component, and/or a polymer, and a second component comprising a stabilizing agent capable of facilitating desorption of one or more low-molecular weight molecules from the channel and having a formula selected from the group consisting of:

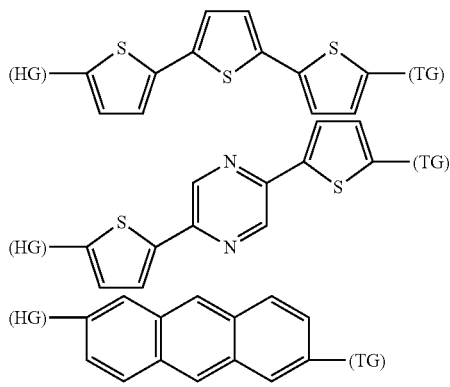

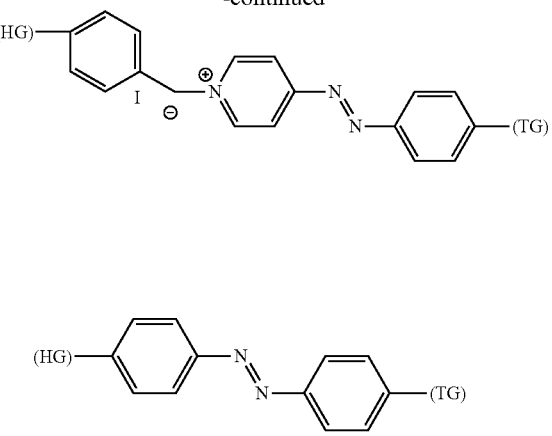

wherein:

HG is selected from the group consisting of a) -L-Y—Si(R$^1$)$_3$, b) -L-Y—P(O)(OR$^2$)$_2$, c) -L-Y—COOH, d) -L-Y—NCO, and e) -L-Y—CNO; wherein R$^1$ and R$^2$, at each occurrence, independently are selected from the group consisting of a) H, b) a halogen, c) a C$_{1-20}$ alkoxy group and d) a C$_{1-20}$ alkyl group; L is selected from the group consisting of a) —O—, b) —C(O)—, c) —OC(O)—, d) —C(O)O—, e) —NR$^4$—, f) —C(O)NR$^4$—, g) —NR$^4$C(O)—, and h) a covalent bond, wherein R$^4$ is selected from the group consisting of a) H, b) a C$_{1-20}$ alkyl group, c) a —C$_{1-20}$ alkyl —NH$_2$; and Y is selected from the group consisting of a divalent alkyl group, a divalent C$_{6-14}$ aryl group, and a covalent bond; and TG has the formula:

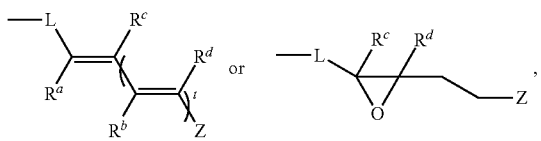

wherein:

L is selected from the group consisting of a) —O—, b) —C(O)—, c) —OC(O)—, d) —C(O)O—, e) —NR$^4$—, f) —C(O)NR$^4$—, g) —NR$^4$C(O)—, and h) a covalent bond, wherein R$^4$ is selected from the group consisting of a) H, b) a C$_{1-20}$ alkyl group, c) a —C$_{1-20}$ alkyl —NH$_2$;

Z is selected from the group consisting of a C1-10 alkyl group, a C1-10 haloalkyl group, a substituted or unsubstituted C6-14 aryl group, and a substituted or unsubstituted 5-14 membered heteroaryl group;

R$^a$ and R$^b$ independently are selected from the group consisting of H, F, Cl, CN, CH$_3$, and CF$_3$;

R$^c$ and R$^d$ independently are selected from the group consisting of H, a C$_{1-10}$ alkyl group, a C$_{1-10}$ haloalkyl group, a substituted or unsubstituted C$_{6-14}$ aryl group, and a substituted or unsubstituted 5-14 membered heteroaryl group; and t is 0 or 1.

15. The metal oxide thin film transistor of claim 14, wherein the stabilizing agent is selected from the group consisting of:

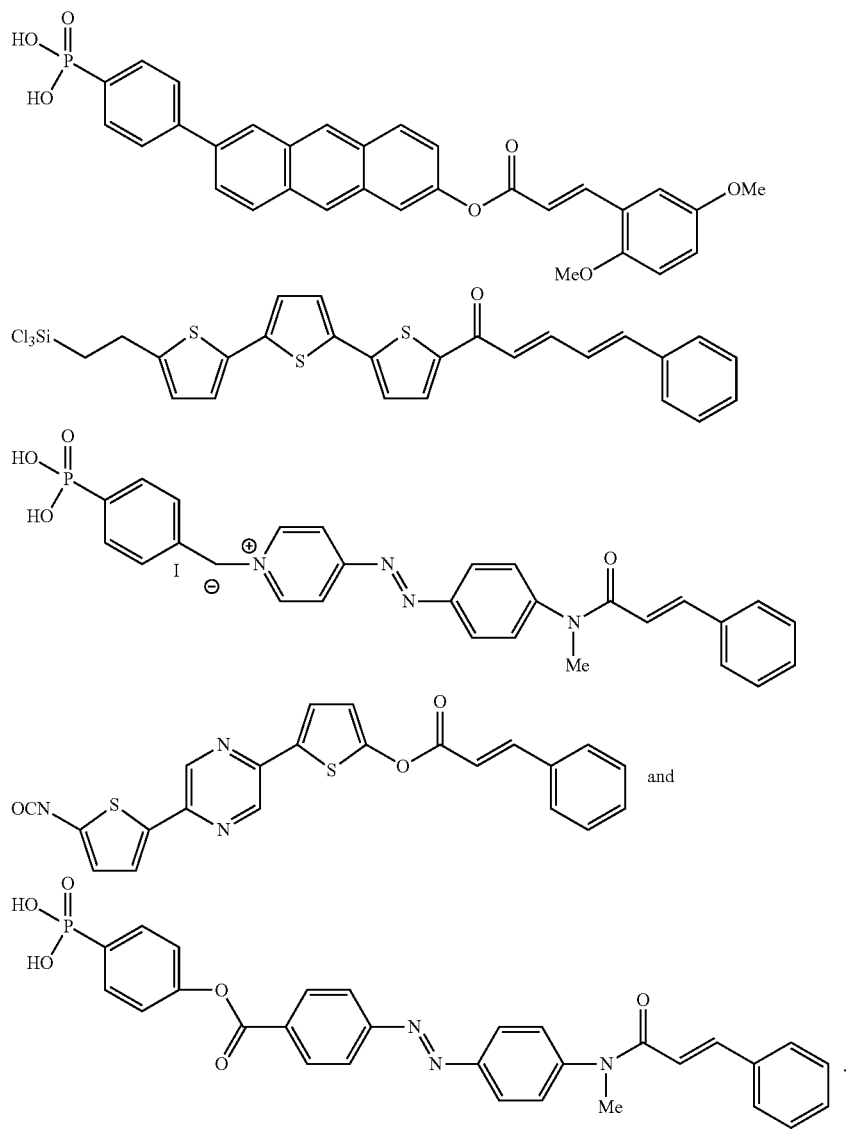

16. A metal oxide thin film transistor comprising a substrate, a gate electrode over the substrate, a gate dielectric over the gate electrode, a metal oxide thin film semiconductor over the gate dielectric, a source electrode and a drain electrode over the metal oxide thin film semiconductor, wherein the source electrode and the drain electrode is separated by a channel area comprising an exposed surface of the metal oxide thin film semiconductor, and a coating material over the channel area and the source and drain electrodes, wherein the coating material comprises a polymerizable or crosslinkable component and a stabilizing agent, wherein the stabilizing agent forms a self-assembled layer directly in contact with the channel and the polymerizable or crosslinkable component forms a polymerized or crosslinked matrix over the self-assembled layer.

17. The metal oxide thin film transistor of claim 16, wherein the stabilizing agent comprises from about 0.01% to about 30% by weight of the polymerizable or crosslinkable component in the coating material.

18. The metal oxide thin film transistor of claim 16, wherein the coating material comprises a crosslinkable component comprising is-a polymer, a small molecule, or a mixture thereof.

19. The metal oxide thin film transistor of claim 16, wherein the polymerizable or crosslinkable component is selected from the group consisting of a cinnamate, a diene, an acrylate, and an epoxide.

20. The metal oxide thin film transistor of claim 16, wherein the metal oxide thin film semiconductor comprises IGZO.

* * * * *